(12) United States Patent
Seto

(10) Patent No.: US 11,450,682 B2
(45) Date of Patent: Sep. 20, 2022

(54) SEMICONDUCTOR MEMORY DEVICE

(71) Applicant: KIOXIA CORPORATION, Tokyo (JP)

(72) Inventor: Motoshi Seto, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 49 days.

(21) Appl. No.: 17/117,542

(22) Filed: Dec. 10, 2020

(65) Prior Publication Data

US 2021/0288062 A1     Sep. 16, 2021

(30) Foreign Application Priority Data

Mar. 12, 2020 (JP) .............................. JP2020-043028

(51) Int. Cl.
  *H01L 27/11578* (2017.01)
  *G11C 16/30* (2006.01)
  (Continued)

(52) U.S. Cl.
  CPC ........ *H01L 27/11578* (2013.01); *G11C 16/30* (2013.01); *H01L 27/11519* (2013.01);
  (Continued)

(58) Field of Classification Search
  CPC ......... H01L 27/11578; H01L 27/11519; H01L 27/11526; H01L 27/11551; H01L 27/11565; H01L 27/11573; H01L 25/18; H01L 2225/06517; H01L 2225/06589; H01L 23/5286; H01L 21/26586; H01L 21/76898; H01L 25/0657; H01L 25/50; H01L 27/11582; H01L 2224/0401; H01L 2225/06513; H01L 2225/06544; H01L 2225/06586; H01L 23/481; H01L 23/5386; H01L 23/49827; H01L 23/49838;
  (Continued)

(56) References Cited

U.S. PATENT DOCUMENTS 6,417,558 B1    7/2002  Shirai
8,518,764 B2    8/2013  Dao et al.
(Continued)

FOREIGN PATENT DOCUMENTS

JP    3602745 B2    12/2004
JP    6222800 B2    11/2017
JP    6479579 B2     3/2019

*Primary Examiner* — Allison Bernstein
(74) *Attorney, Agent, or Firm* — Oblon, McClelland, Maier & Neustadt, L.L.P.

(57) ABSTRACT

A semiconductor memory device comprises: a semiconductor substrate comprising a first and a second surface; a first and a second electrode provided on a first surface side; a third and a fourth electrode provided on a second surface side; a first through-electrode connected to the first and the third electrode; a second through-electrode connected to the second and the fourth electrode; and a first insulating layer comprising a first and a second portion. The semiconductor substrate comprises: a first impurity region of N type facing a surface of the first through-electrode via the first portion; a second impurity region of N type facing a surface of the second through-electrode via the second portion; and a third impurity region of P type provided between the first and the second impurity region.

20 Claims, 34 Drawing Sheets

(51) Int. Cl.
  *H01L 27/11519* (2017.01)
  *H01L 27/11573* (2017.01)
  *H01L 27/11551* (2017.01)
  *H01L 27/11565* (2017.01)
  *H01L 27/11526* (2017.01)

(52) U.S. Cl.
  CPC .. *H01L 27/11526* (2013.01); *H01L 27/11551* (2013.01); *H01L 27/11565* (2013.01); *H01L 27/11573* (2013.01)

(58) Field of Classification Search
  CPC ..... H01L 23/5384; G11C 16/30; G11C 16/10; G11C 16/24; G11C 16/26
  See application file for complete search history.

(56) References Cited

U.S. PATENT DOCUMENTS

| | | |
|---|---|---|
| 8,810,010 B2 | 8/2014 | Kim |
| 10,024,907 B2 | 7/2018 | Watanabe et al. |
| 2014/0284690 A1* | 9/2014 | Arai ............... H01L 29/792 257/324 |
| 2015/0132950 A1 | 5/2015 | Jung et al. |

* cited by examiner

_US 11,450,682 B2_

SEMICONDUCTOR MEMORY DEVICE

CROSS-REFERENCE TO RELATED APPLICATIONS

This application is based upon and claims the benefit of Japanese Patent Application No. 2020-043028, filed on Mar. 12, 2020, the entire contents of which are incorporated herein by reference.

BACKGROUND

Field

Embodiments relate to a semiconductor memory device.

Description of the Related Art

There is known a semiconductor memory device comprising: a semiconductor substrate comprising a first surface and a second surface; a first electrode and a second electrode provided on a first surface side of the semiconductor substrate; a third electrode and a fourth electrode provided on a second surface side of the semiconductor substrate; a first through-electrode extending in a first direction intersecting the first surface and the second surface and including one end in the first direction and the other end in the first direction, the one end being connected to the first electrode, the other end being connected to the third electrode; and a second through-electrode extending in the first direction and including one end in the first direction and the other end in the first direction, the one end being connected to the second electrode, the other end being connected to the fourth electrode.

DETAILED DESCRIPTION

Figure 1:
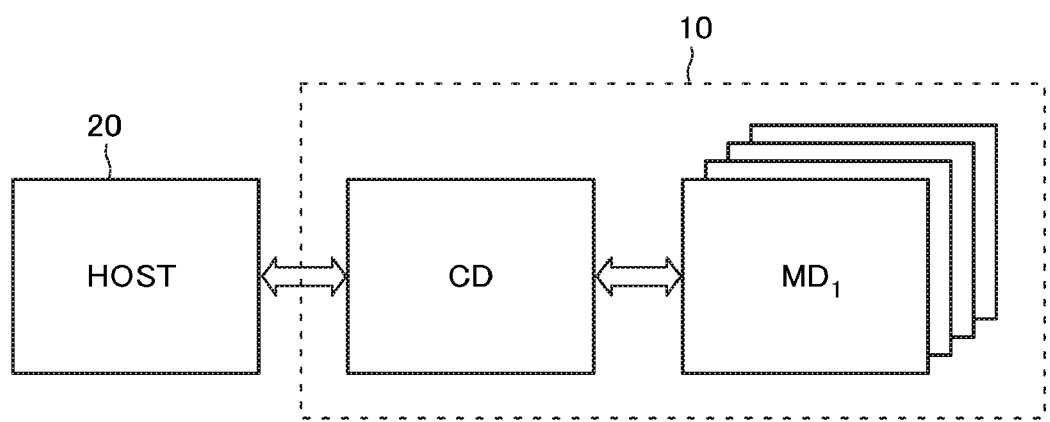
FIG. 1 is a schematic block diagram showing a configuration of a memory system 10 according to a first embodiment.

A semiconductor memory device according to an embodiment comprises: a semiconductor substrate comprising a first surface and a second surface; a first electrode and a second electrode provided on a first surface side of the semiconductor substrate; a third electrode and a fourth electrode provided on a second surface side of the semiconductor substrate; a first through-electrode extending in a first direction intersecting the first surface and the second surface and including one end in the first direction and the other end in the first direction, the one end being connected to the first electrode, the other end being connected to the third electrode; a second through-electrode extending in the first direction and including one end in the first direction and the other end in the first direction, the one end being connected to the second electrode, the other end being connected to the fourth electrode; and a first insulating layer provided between the semiconductor substrate and the first through-electrode and provided between the semiconductor substrate and the second through-electrode. Moreover, the first insulating layer comprises: a first portion provided between the semiconductor substrate and the first through-electrode; and a second portion provided between the semiconductor substrate and the second through-electrode. Furthermore, the second surface side of the semiconductor substrate comprises: a first impurity region of N type facing an outer peripheral surface of the first through-electrode via the first portion; a second impurity region of N type facing an outer peripheral surface of the second through-electrode via the second portion and being separated from the first impurity region; and a third impurity region of P type provided between the first impurity region and the second impurity region, the third impurity region contacting the first impurity region.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of embodiments will be assigned with the same symbols, and descriptions thereof will sometimes be omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been serially connected, the second transistor is in an OFF state, the first transistor is still "electrically connected" to the third transistor.

Moreover, in the present specification, when a first configuration is said to be "connected between" a second configuration and a third configuration, it will sometimes mean that the first configuration, the second configuration, and the third configuration are serially connected, and the first configuration is provided in a current path of the second configuration and the third configuration.

Moreover, in the present specification, sometimes, a direction lying along a certain plane will be called a first direction, a direction intersecting the first direction along this certain plane will be called a second direction, and a direction intersecting this certain plane will be called a third direction. These first direction, second direction, and third direction may, but need not, correspond to any of an X direction, a Y direction, and a Z direction exemplified in the specification.

First Embodiment

FIG. 1 is a schematic block diagram showing a configuration of a memory system 10 according to a first embodiment.

The memory system 10 performs read, write, erase, and so on, of user data, in response to a signal transmitted from a host computer 20. The memory system 10 is a memory chip, a memory card, an SSD, or another system capable of storing user data, for example. The memory system 10 comprises: a plurality of memory dies $MD_1$ storing user data; and a control die CD connected to these plurality of memory dies $MD_1$ and the host computer 20. The control die CD comprises the likes of a processor and a RAM, for example, and performs processing, such as conversion of a logical address and a physical address, bit error detection/correction, garbage collection (compaction), and wear leveling.

Figure 2:
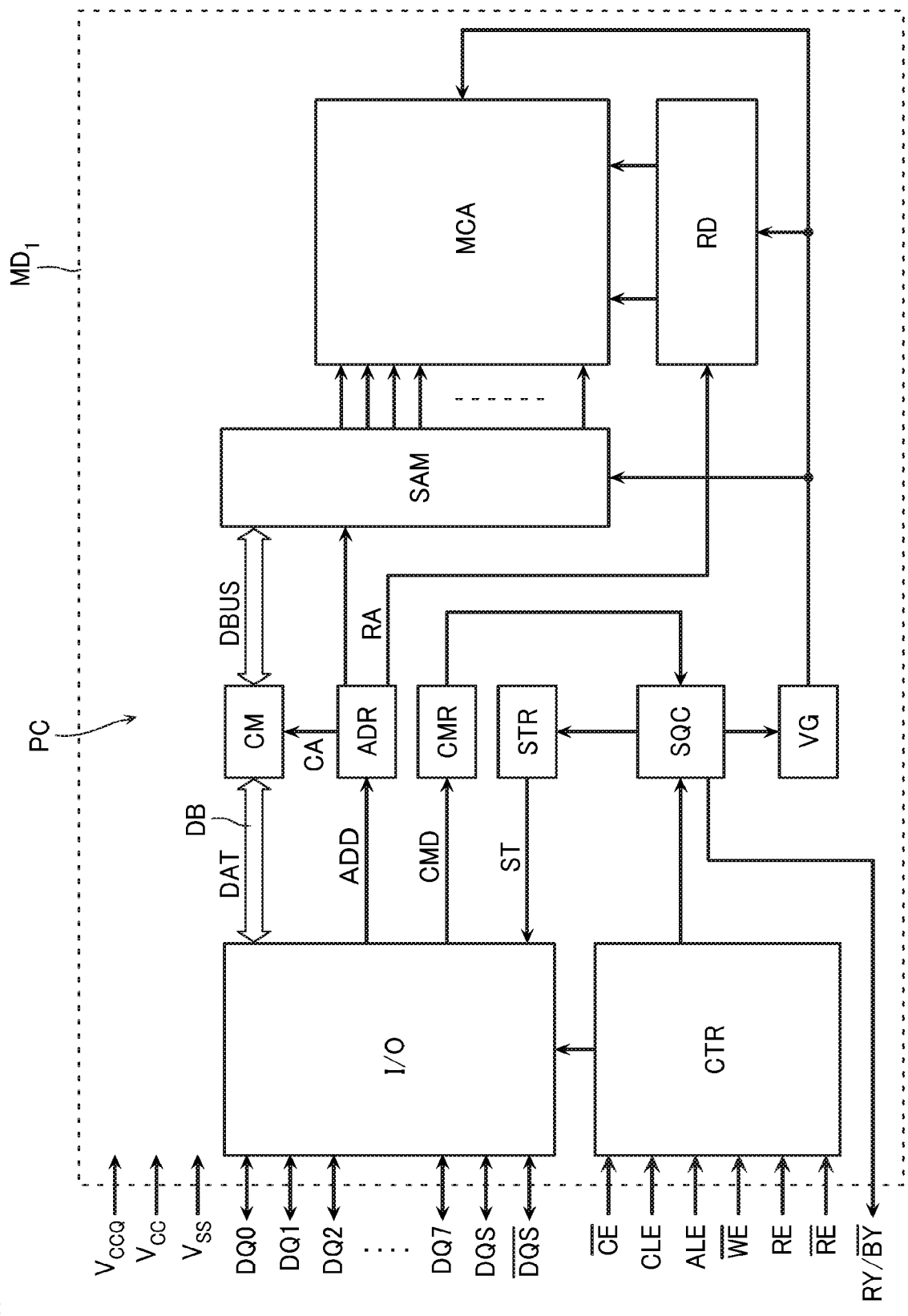
FIG. 2 is a schematic block diagram showing a configuration of a memory die $MD_1$ according to the first embodiment.

FIG. 2 is a schematic block diagram showing a configuration of the memory die $MD_1$ according to the first embodiment. Note that in FIG. 2, a plurality of control terminals, and so on, are illustrated. These plurality of control terminals are in some cases indicated as a control terminal corresponding to a high active signal (a positive logic signal), in some cases indicated as a control terminal corresponding to a low active signal (a negative logic signal), and in some cases indicated as a control terminal corresponding to both a high active signal and a low active signal. In FIG. 2, a symbol of a control terminal corresponding to a low active signal includes an overline. In the present specification, a symbol of a control terminal corresponding to a low active signal includes a slash ("/").

As shown in FIG. 2, the memory die $MD_1$ comprises: a memory cell array MCA that stores data; and a peripheral circuit PC connected to the memory cell array MCA. The peripheral circuit PC comprises a voltage generating circuit VG, a row decoder RD, a sense amplifier module SAM, and a sequencer SQC. In addition, the peripheral circuit PC comprises a cache memory CM, an address register ADR, a command register CMR, and a status register STR. In addition, the peripheral circuit PC comprises an input/output control circuit I/O and a logic circuit CTR.

The memory cell array MCA includes a plurality of bit lines, a plurality of word lines, and a plurality of memory cells connected to these pluralities of bit lines and word lines. These plurality of memory cells each store 1 bit or multiple bits of data. A variety of configurations are applicable as the memory cell array MCA. For example, the memory cell array MCA may include a memory transistor that includes in its gate insulating film a charge accumulating film, a ferroelectric film, or another memory film. Moreover, the memory cell array MCA may be a phase change memory which includes a chalcogenide film of the likes of GeSbTe, and in which a crystalline state of the chalcogenide film changes in response to a write operation. Moreover, the memory cell array MCA may be an MRAM (Magnetoresistive Random Access Memory) which includes an opposingly-disposed pair of ferromagnetic films and a tunnel insulating film provided between these ferromagnetic films, and in which magnetization directions of the above-described ferromagnetic films change in response to a write operation. Moreover, the memory cell array MCA may be a ReRAM (Resistance Random Access Memory) which includes a pair of electrodes and a metal oxide, or the like, provided between these electrodes, and in which the above-described fellow electrodes are electrically continuous via the likes of a filament of oxygen vacancies, or the like, in response to a write operation. Moreover, the memory cell array MCA may be a DRAM (Dynamic Random Access Memory) which comprises a capacitor and a transistor, and in which charging/discharging of the capacitor is performed during a write operation and a read operation. Moreover, the memory cell array MCA may have another configuration.

The voltage generating circuit VG includes the likes of a step-down circuit such as a regulator, and a booster circuit such as a charge pump circuit, for example. These step-down circuit, booster circuit, and so on, are each connected to terminals supplied with a power supply voltage $V_{CC}$ and a ground voltage $V_{SS}$. The voltage generating circuit VG generates and simultaneously outputs to a plurality of voltage supply lines a plurality of types of operation voltages to be applied to the bit lines, the word lines, and so on, during a read operation, a write operation, and an erase operation on the memory cell array MCA, according to a control signal from the sequencer SQC, for example. The operation voltages outputted from the voltage supply lines are appropriately adjusted according to a control signal from the sequencer SQC.

The row decoder RD comprises, for example: an address decoder that decodes a row address RA in address data ADD; and a switch circuit that appropriately causes a word line in the memory cell array MCA to be electrically continuous with a voltage supply line in response to an output signal of the address decoder.

The sense amplifier module SAM comprises a plurality of sense amplifier units that are connected to a plurality of the bit lines in the memory cell array MCA. The sense amplifier units each comprise: a sense circuit and a switch circuit that are connected to the bit line; and a latch circuit that is connected to these sense circuit and switch circuit. The latch circuit latches read data that has been read from the memory cell and write data to be written to the memory cell. The sense circuit causes the latch circuit to latch data appropriate to magnitude of a voltage or current of the bit line as read data during a read operation, and so on. The switch circuit causes the voltage supply lines corresponding to each of bits of write data latched in the latch circuit to be electrically continuous with the bit lines, correspondingly to the write data, during a write operation, and so on.

The cache memory CM is connected to the latch circuit in the sense amplifier module SAM via a data bus DBUS. The cache memory CM comprises a plurality of latch circuits corresponding to a plurality of the latch circuits in the sense amplifier module SAM. The cache memory CM has latched therein data DAT corresponding to read data and write data.

Note that the sense amplifier module SAM or the cache memory CM comprises an unillustrated decode circuit and an unillustrated switch circuit. The decode circuit decodes a column address CA held in the address register ADR. The switch circuit may cause the latch circuit corresponding to the column address CA to be electrically continuous with a bus DB, depending on an output signal of the decode circuit. Moreover, the switch circuit may cause the bit line corresponding to the column address CA to be electrically continuous with a sense amplifier unit, depending on an output signal of the decode circuit.

The sequencer SQC sequentially decodes command data CMD latched in the command register CMR, and outputs internal control signals to the row decoder RD, the sense amplifier module SAM, and the voltage generating circuit VG. In addition, the sequencer SQC appropriately outputs status data ST indicating a state of the sequencer SQC itself to the status register STR. Moreover, the sequencer SQC generates a ready/busy signal, and outputs the ready/busy signal to a terminal RY/(/BY).

The input/output control circuit I/O comprises: data signal input/output terminals DQ0-DQ7; clock signal input/output terminals DQS, /DQS; and an input circuit such as a comparator and output circuit such as an OCD (Off Chip Driver) circuit that are connected to the data signal input/output terminals DQ0-DQ7. In addition, the input/output control circuit I/O comprises: a shift register connected to these input circuit and output circuit; and a buffer circuit. The input circuit, the output circuit, the shift register, and the buffer circuit are each connected to terminals supplied with a power supply voltage $V_{CCQ}$ and the ground voltage $V_{SS}$. Data that has been inputted via the data signal input/output terminals DQ0-DQ7 is outputted to the cache memory CM, the address register ADR, or the command register CMR from the buffer circuit, in response to an internal control signal from the logic circuit CTR. Moreover, data outputted via the data signal input/output terminals DQ0-DQ7 is inputted to the buffer circuit from the cache memory CM or the status register STR, in response to an internal control signal from the logic circuit CTR.

The logic circuit CTR receives an external control signal from the control die CD via external control terminals /CE, CLE, ALE, /WE, RE, /RE, and outputs an internal control signal to the input/output control circuit I/O depending on this external control signal.

Figure 3:
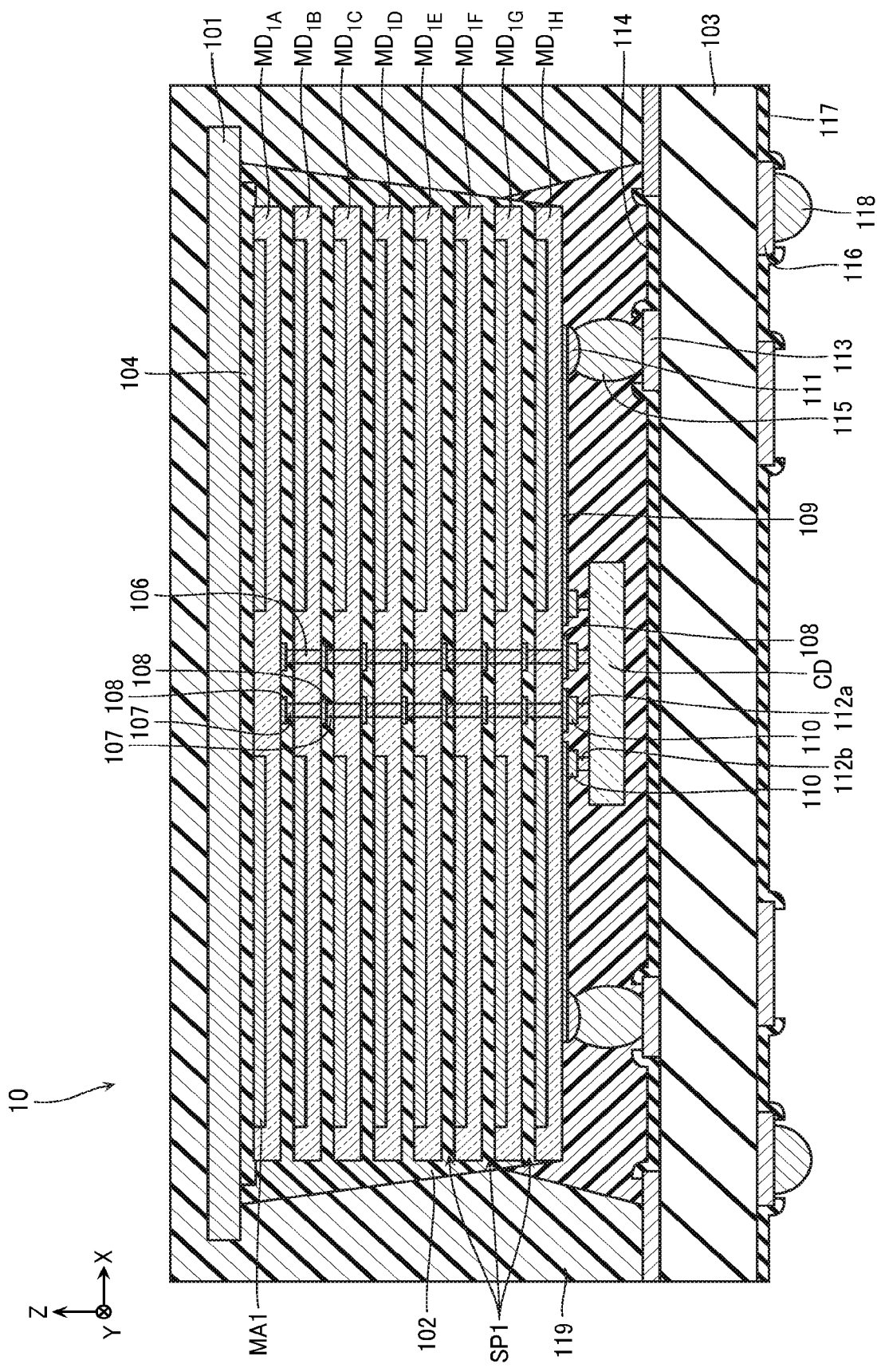
FIG. 3 is a schematic cross-sectional view showing a configuration example of the memory system 10 according to the first embodiment.

FIG. 3 is a schematic cross-sectional view showing a configuration example of the memory system 10 according to the first embodiment.

Note that in the following description, there is shown an example where the memory system 10 comprises eight memory dies $MD_{1A}$-$MD_{1H}$ as the above-mentioned memory dies $MD_1$. However, such a configuration is merely an exemplification, and the number of memory dies $MD_1$ mounted on the memory system 10 is appropriately adjustable.

Moreover, in the following description, a certain direction parallel to a surface of a mounting substrate 103 exemplified in FIG. 3 will be called an X direction, a direction parallel to this surface and perpendicular to the X direction will be called a Y direction, and a direction perpendicular to this surface will be called a Z direction.

The memory system 10 according to the present embodiment comprises: a supporting substrate 101; a plurality of memory dies $MD_{1A}$-$MD_{1H}$ stacked on the supporting substrate 101; and a resin member 102 that seals these plurality of memory dies $MD_{1A}$-$MD_{1H}$. In addition, the memory system 10 according to the present embodiment comprises: the control die CD which is connected to the memory die $MD_{1H}$; and the mounting substrate 103 on which these configurations are mounted.

The supporting substrate 101 may be a metal plate such as a lead frame, for example. A material of the supporting substrate 101 may be copper (Cu), or may be a 42 alloy (an Fe—Ni based alloy), for example. Moreover, the supporting substrate 101 may be provided with an adhesive agent 104 having insulating properties that connects the supporting substrate 101 and the memory die $MD_{1A}$.

The plurality of memory dies $MD_{1A}$-$MD_{1H}$ are each disposed so that their front-face is provided on a mounting substrate 103 side, and their rear-face is provided on an opposite side to the mounting substrate 103. Moreover, the plurality of memory dies $MD_{1A}$-$MD_{1H}$ are aligned in the Z direction. Moreover, the plurality of memory dies $MD_{1A}$-$MD_{1H}$ each comprise: a plurality of through-conductive portions 106 that are provided from the rear-face (an upper surface in FIG. 3) to the front-face (a lower surface in FIG. 3) of the memory dies $MD_{1B}$-$MD_{1H}$; a rear-face electrode 107 connected to an end portion on a rear-face side (an upper end portion in FIG. 3) of these plurality of through-conductive portions 106; and a front-face electrode 108 connected to an end portion on a front-face side (a lower end portion in FIG. 3) of these plurality of through-conductive portions 106. Note that the memory die $MD_{1A}$ may, but need not, include the through-conductive portion 106 and the rear-face electrode 107. These plurality of memory dies $MD_{1A}$-$MD_{1H}$ are electrically connected to each other via the through-conductive portion 106, the rear-face electrode 107, and the front-face electrode 108.

Note that the memory dies $MD_{1A}$-$MD_{1H}$ comprise a plurality of terminals, as described with reference to FIG. 2. The through-conductive portion 106 of FIG. 3 functions as any of these plurality of terminals. For example, some of these plurality of through-conductive portions 106 function as the terminal supplied with the power supply voltage $V_{CC}$, the power supply voltage $V_{CCQ}$, or the ground voltage $V_{SS}$. Moreover, some of these plurality of through-conductive portions 106 function as the data signal input/output terminals DQ0-DQ7. Moreover, some of these plurality of through-conductive portions 106 function as the clock signal input/output terminals DQS, /DQS. Moreover, some of these plurality of through-conductive portions 106 function as the external control terminals /CE, CLE, ALE, /WE, RE, /RE. Moreover, some of these plurality of through-conductive portions 106 function as the terminal RY/(/BY).

Moreover, the front-face (the lower surface in FIG. 3) of the memory die $MD_{1H}$ comprises: a connection wiring 109 provided on the front-face of the memory die $MD_{1H}$; a connection electrode 110 provided correspondingly to the front-face electrode 108 and the connection wiring 109; and a pad electrode 111 provided to the connection wiring 109.

The control die CD is disposed so that its front-face is provided on the opposite side to the mounting substrate 103, and its rear-face is provided on the mounting substrate 103 side. The control die CD comprises a plurality of connection electrodes 112a, 112b that are provided on its front-face (its upper surface in FIG. 3). These plurality of connection electrodes are respectively connected to the connection electrodes 110 provided to the memory die $MD_{1H}$. The control die CD is electrically connected to the memory dies $MD_{1A}$-$MD_{1H}$ via the plurality of connection electrodes 112a. Moreover, the control die CD is electrically connected to the host computer 20 (FIG. 1) via the plurality of connection electrodes 112b.

The front-face (an upper surface in FIG. 3) of the mounting substrate 103 is provided with: a print wiring 113; and a solder resist 114 that covers the front-face of the mounting substrate 103 and a side surface of the print wiring 113. The print wiring 113 is connected, via a bump electrode 115, to the pad electrode 111 provided on the front-face of the memory die $MD_{1H}$.

A rear-face (a lower surface in FIG. 3) of the mounting substrate 103 is provided with: a print wiring 116; and a solder resist 117 that covers the rear-face of the mounting substrate 103 and a side surface of the print wiring 116. The print wiring 116 is electrically connected to the print wiring 113 provided on the front-face of the mounting substrate 103. Moreover, part of the print wiring 116 is provided with a bump electrode 118.

Note that the supporting substrate 101, the memory dies $MD_{1A}$-$MD_{1H}$, and the control die CD, that are provided on the front-face side of the mounting substrate 103, are sealed by a resin member 119.

Note that the configuration shown in FIG. 3 is merely an exemplification, and a specific configuration is appropriately adjustable. For example, in the example shown in FIG. 3, the memory dies $MD_{1A}$-$MD_{1H}$ and the control die CD are provided to the mounting substrate 103. In such a configuration, the plurality of memory dies $MD_1$ and the control die CD are included in one package. However, the control die CD may be included in a package separate from that of the memory dies $MD_1$.

Figure 4A:
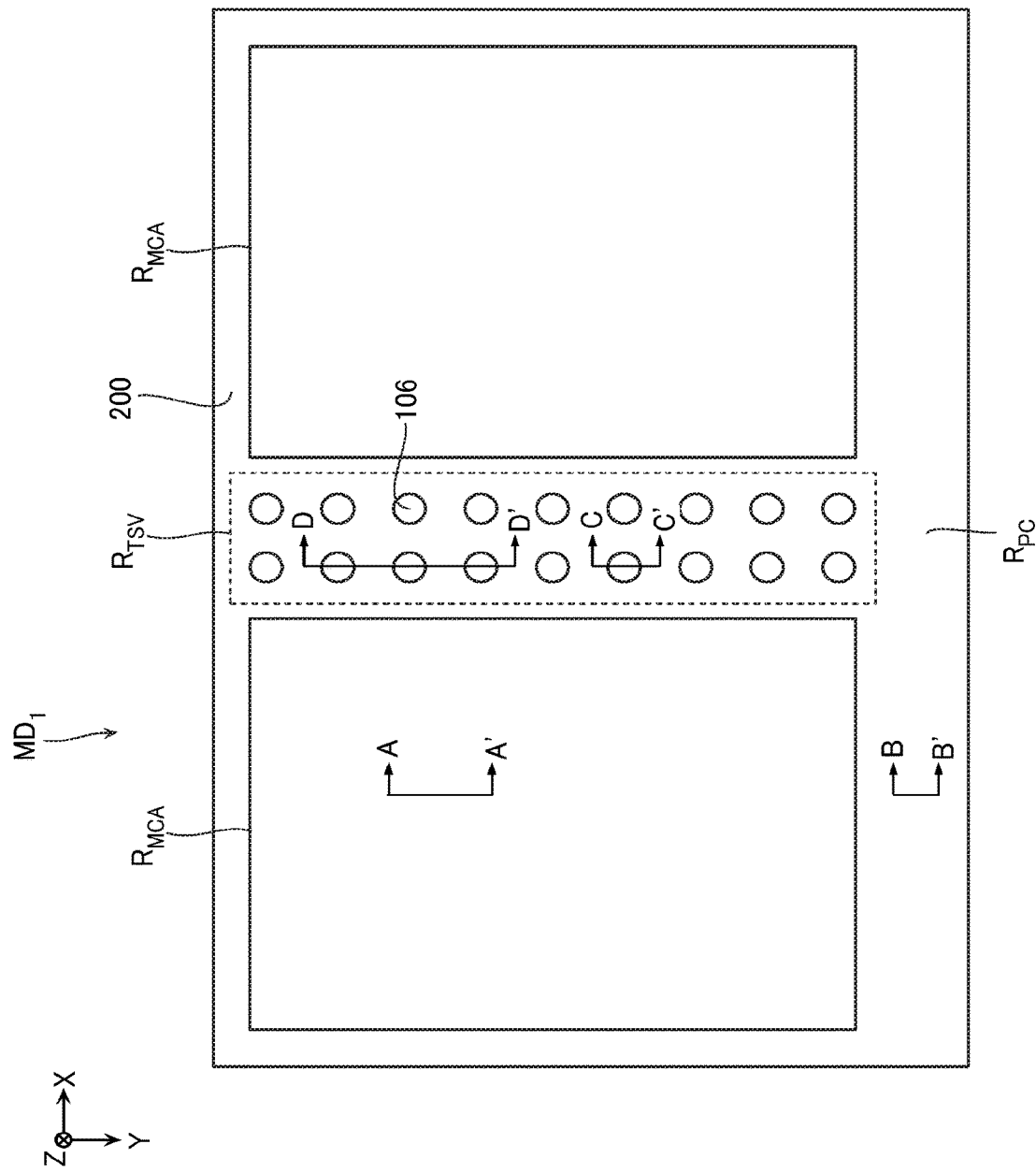
FIG. 4A is a schematic lower surface view showing a configuration example of the memory die $MD_1$.

FIG. 4A is a schematic lower surface view showing a configuration example of the memory die $MD_1$.

As shown in FIG. 4A, the memory die $MD_1$ comprises a semiconductor substrate 200. In the illustrated example, the semiconductor substrate 200 is provided with two memory cell array regions $R_{MCA}$ that are aligned in the X direction. Moreover, between these memory cell array regions $R_{MCA}$, there is provided a through-electrode region $R_{TSV}$. Moreover, an end portion in the Y direction of the semiconductor substrate 200 is provided with a peripheral circuit region $R_{PC}$ that extends in the X direction.

Figure 4B:
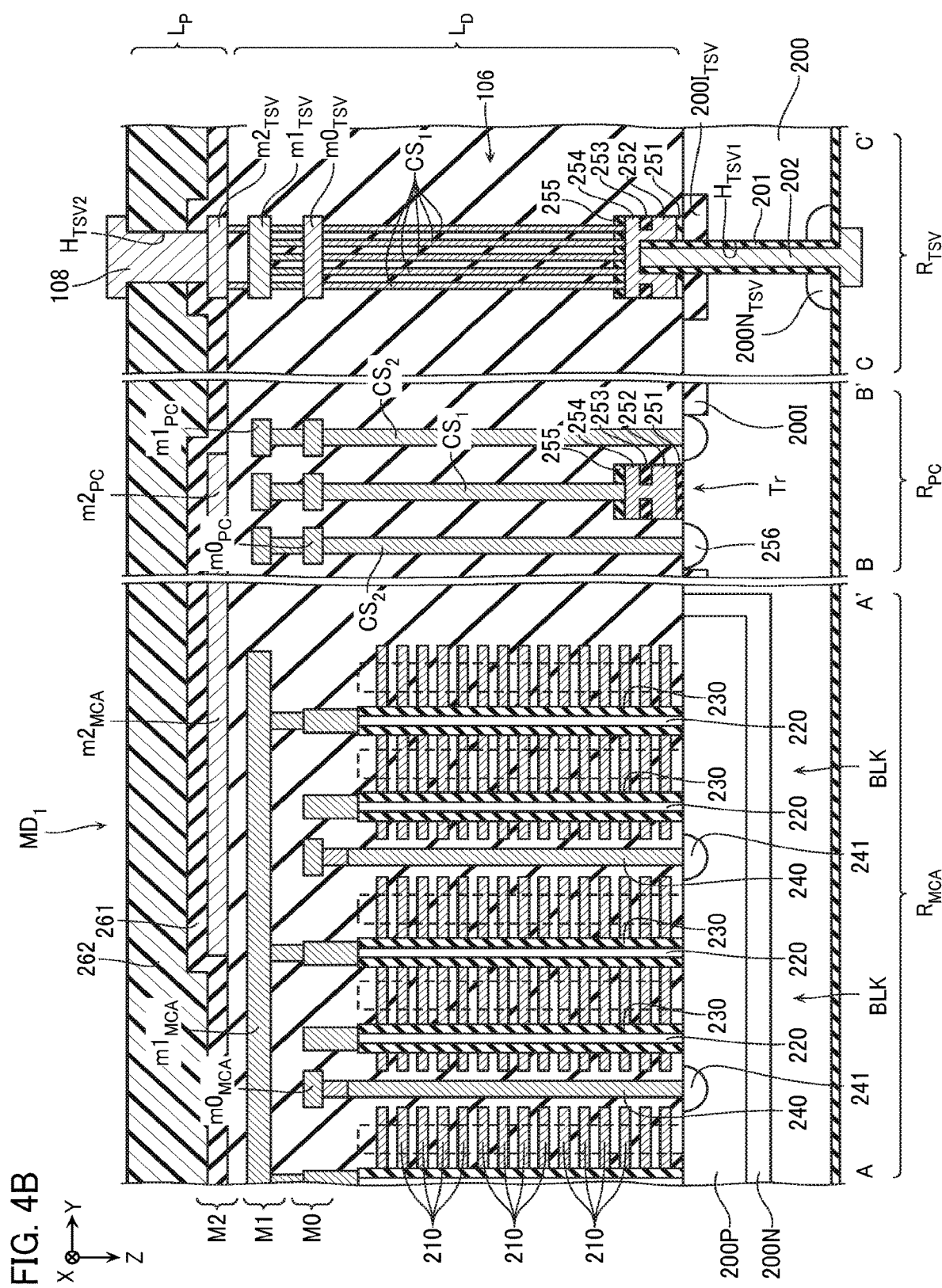
FIG. 4B is a schematic cross-sectional view showing a configuration example of the memory die $MD_1$.

FIG. 4B is a schematic cross-sectional view showing a configuration example of the memory die $MD_1$. FIG. 4B shows cross-sections of the configuration shown in FIG. 4A, taken along the line A-A', the line B-B', and the line C-C', looking in the direction of the arrows.

As shown in FIG. 4B, the memory die $MD_1$ comprises: a device layer $L_D$ provided on a front-face of the semiconductor substrate 200; and a surface-side protective layer $L_P$ provided on the device layer $L_D$.

The semiconductor substrate 200 is a semiconductor substrate configured from P type silicon (Si) that includes boron (B) or another P type impurity, for example. The front-face (an upper surface in FIG. 4B) of the semiconductor substrate 200 is provided with: an N type well region 200N that includes phosphorus (P), arsenic (As), or another N type impurity; a P type well region 200P that includes boron (B) or another P type impurity; and an insulating region 200I, for example.

A portion corresponding to the memory cell array region $R_{MCA}$, of the front-face (the upper surface in FIG. 4B) of the semiconductor substrate 200, for example, has formed therein a double well structure that includes the N type well region 200N and the P type well region 200P. The P type well region 200P functions as part of the memory cell array MCA (FIG. 2).

Moreover, a portion corresponding to the peripheral circuit region $R_{PC}$, of the front-face (the upper surface in FIG. 4B) of the semiconductor substrate 200, for example, has the peripheral circuit PC which is configured by the likes of a transistor Tr and a capacitor.

Moreover, a portion corresponding to the through-electrode region $R_{TSV}$, of the front-face (the upper surface in FIG. 4B) of the semiconductor substrate 200, for example, may be provided with an insulating region $200I_{TSV}$. Moreover, the portion corresponding to the through-electrode region $R_{TSV}$, of the rear-face (the lower surface in FIG. 4B) of the semiconductor substrate 200 is provided with an N type impurity region $200N_{TSV}$. The impurity region $200N_{TSV}$ is provided along a rear-face of the semiconductor substrate 200. The N type impurity region $200N_{TSV}$ includes phosphorus (P), arsenic (As), or another N type impurity, for example. Moreover, the portion corresponding to the through-electrode region $R_{TSV}$, of the semiconductor substrate 200 is provided with a through-hole $H_{TSV1}$ that penetrates the semiconductor substrate 200 from the above-described insulating region $200I_{TSV}$ to the above-described impurity region $200N_{TSV}$. Moreover, this through-hole $H_{TSV1}$ has its inner peripheral surface provided with an insulating layer 201 of the likes of silicon oxide ($SiO_2$). Moreover, this through-hole $H_{TSV1}$ has its inside provided with a substrate through-electrode 202 via the insulating layer 201. The substrate through-electrode 202 functions as part of the above-described through-conductive portion 106 (FIGS. 3 and 4A).

The memory cell array region $R_{MCA}$ of the device layer $L_D$ is provided with a plurality of memory blocks BLK aligned in the Y direction. The memory block BLK comprises: a plurality of conductive layers 210 aligned in the Z direction; a plurality of semiconductor layers 220 extending in the Z direction; and a plurality of gate insulating films 230 respectively provided between the plurality of conductive layers 210 and the plurality of semiconductor layers 220. The conductive layer 210 is a substantially plate-like conductive layer extending in the X direction. The conductive layer 210 may include a laminated film of a barrier conductive film of the likes of titanium nitride (TiN) and a metal film of the likes of tungsten (W), or the like. The semiconductor layers 220 are aligned in a certain pattern in the X direction and the Y direction. The semiconductor layer 220 is a semiconductor layer of the likes of polycrystalline silicon (Si), for example. The gate insulating film 230 comprises a tunnel insulating film of the likes of silicon oxide ($SiO_2$), a charge accumulating film of the likes of silicon nitride (SiN), and a block insulating film of the likes of silicon oxide ($SiO_2$), for example. Note that the gate insulating film 230 may comprise a floating gate of the likes of polycrystalline silicon, instead of the charge accumulating film of the likes of silicon nitride (SiN).

In addition, the memory cell array region $R_{MCA}$ of the device layer $L_D$ is provided with a conductive layer 240 that extends in the Z direction and is connected to the front-face of the semiconductor substrate 200. Moreover, a connecting portion of this conductive layer 240 and the semiconductor substrate 200 is provided with an N type impurity region 241. The conductive layer 240 is provided between the memory blocks BLK, for example. The conductive layer 240 may include a laminated film of a barrier conductive film of the likes of titanium nitride (TiN) and a metal film of the likes of tungsten (W), or the like. The N type impurity region 241 is implanted with phosphorus (P), arsenic (As), or another N type impurity, for example.

The peripheral circuit region $R_{PC}$ and the through-electrode region $R_{TSV}$ of the device layer $L_D$ are provided with: a plurality of insulating layers 251 provided on the front-face of the semiconductor substrate 200; a plurality of semiconductor layers 252 provided on surfaces of the plurality of insulating layers 251; a plurality of insulating layers 253 provided on surfaces of the plurality of semiconductor layers 252; a plurality of conductive layers 254 provided on surfaces of the plurality of insulating layers 253; and a plurality of insulating layers 255 provided on surfaces of the plurality of conductive layers 254. The insulating layer 251 includes the likes of silicon oxide ($SiO_2$), for example. The semiconductor layer 252 includes the likes of polycrystalline silicon (Si), for example. The insulating layer 253 includes the likes of silicon oxide ($SiO_2$), for example. The conductive layer 254 includes, for example, a laminated film of polycrystalline silicon (Si) and a metal film of the likes of tungsten (W), or the like. The insulating layer 255 includes the likes of silicon nitride (SiN), for example.

At least parts provided in the peripheral circuit region $R_{PC}$, of these configurations (the insulating layer 251, the semiconductor layer 252, the insulating layer 253, the conductive layer 254, the insulating layer 255) function as part of the transistor Tr. Such a semiconductor layer 252 faces a region other than the insulating region $200I$ of the semiconductor substrate 200. Moreover, such a conductive layer 254 is connected to the semiconductor layer 252.

Moreover, at least parts provided in the through-electrode region $T_{TSV}$, of these configurations (the insulating layer 251, the semiconductor layer 252, the insulating layer 253, the conductive layer 254, the insulating layer 255) function as part of the above-described through-conductive portion 106 (FIGS. 3 and 4A). Such a semiconductor layer 252 faces the insulating region $200I_{TSV}$ of the semiconductor substrate 200. Moreover, such a conductive layer 254 is connected to the semiconductor layer 252.

In addition, the peripheral circuit region $R_{PC}$ and the through-electrode region $R_{TSV}$ of the device layer $L_D$ are provided with: a contact $CS_1$ that extends in the Z direction and is connected to the conductive layer 254; and a contact $CS_2$ that extends in the Z direction and is connected to the front-face of the semiconductor substrate 200. Moreover, a connecting portion of the contact $CS_2$ and the semiconductor substrate 200 is provided with an impurity region 256. The contacts $CS_1$, $CS_2$ may include, for example, a laminated film of a barrier conductive film of the likes of titanium nitride (TiN) and a metal film of the likes of tungsten (W), or the like. The impurity region 256 may be implanted with phosphorus (P), arsenic (As), or another N type impurity, or may be implanted with boron (B) or another P type impurity, for example.

At least parts provided in the peripheral circuit region $R_{PC}$, of these configurations (the contact $CS_1$, the contact $CS_2$) function as parts of the above-described peripheral circuit PC (FIG. 2), along with the above-described transistor Tr.

Moreover, at least parts provided in the through-electrode region $R_{TSV}$ of these configurations (the contact $CS_1$, the contact $CS_2$) function as part of the above-described through-conductive portion 106 (FIGS. 3 and 4A).

In addition, the memory cell array region $R_{MCA}$, the peripheral circuit region $R_{PC}$, and the through-electrode region $R_{TSV}$ of the device layer $L_D$ are provided with metal wiring layers M0, M1, M2 that are provided further to a front-face side (an upper side of FIG. 4B) of the memory die $MD_1$ than the memory blocks BLK, conductive layers 240, and so on, are. The metal wiring layer M0 comprises a plurality of wirings m0. These plurality of wirings m0 may include a laminated film of a barrier conductive film of the likes of titanium nitride (TiN) and a metal film of the likes of tungsten (W), or the like. The metal wiring layer M1 comprises a plurality of wirings m1. These plurality of wirings m1 may include a laminated film of a barrier conductive film of the likes of titanium nitride (TiN) and a metal film of the likes of copper (Cu), or the like. The metal wiring layer M2 comprises a plurality of wirings m2. These plurality of wirings m2 may include a laminated film of a barrier conductive film of the likes of titanium nitride (TiN) and a metal film of the likes of aluminum (Al), or the like.

A wiring $m0_{MCA}$ provided in the memory cell array region $R_{MCA}$, of the plurality of wirings m0 in the metal wiring layer M0 is connected to the conductive layer 240. A wiring $m1_{MCA}$ provided in the memory cell array region $R_{MCA}$, of the plurality of wirings m1 in the metal wiring layer M1 is connected to the semiconductor layer 220.

Moreover, wirings $m0_{PC}$, $m1_{PC}$, $m2_{PC}$ provided in the peripheral circuit region $R_{PC}$, of the pluralities of wirings m0, m1, m2 in the metal wiring layers M0, M1, M2 are connected to the contacts $CS_1$, $CS_2$. These wirings $m0_{PC}$, $m1_{PC}$, $m2_{PC}$ function as parts of the above-described peripheral circuit PC (FIG. 2), along with the above-described transistor Tr.

Moreover, wirings $m0_{TSV}$, $m1_{TSV}$, $m2_{TSV}$ provided in the through-electrode region $R_{TSV}$ of the pluralities of wirings m0, m1, m2 in the metal wiring layers M0, M1, M2 are connected to the contact CS$_1$. These wirings m0$_{TSV}$, m1$_{TSV}$, m2$_{TSV}$ function as part of the above-described through-conductive portion 106 (FIGS. 3 and 4A). Moreover, parts of these configurations are connected to the wirings m0$_{PC}$, M1$_{PC}$, M2$_{PC}$, although illustration of this is omitted.

The front-face-side protective layer L$_P$ comprises: an inorganic-based protective film 261 provided on a front-face (an upper surface in FIG. 4B) of the device layer L$_D$; and an organic-based protective film 262 provided on a surface of this inorganic-based protective film 261. The inorganic-based protective film 261 includes silicon oxide (SiO$_2$), silicon nitride (SiN), or a laminated film including these, for example. The organic-based protective film 262 includes a polyimide-based resin or a phenol-based resin, for example.

A portion corresponding to the through-electrode region R$_{TSV}$, of the surface-side protective layer L$_P$, for example, is provided with a through-hole H$_{TSV2}$ that penetrates the inorganic-based protective film 261 and the organic-based protective film 262. Moreover, this through-hole H$_{TSV2}$ has its inside provided with the front-face electrode 108 described with reference to FIG. 3.

Figure 4C:
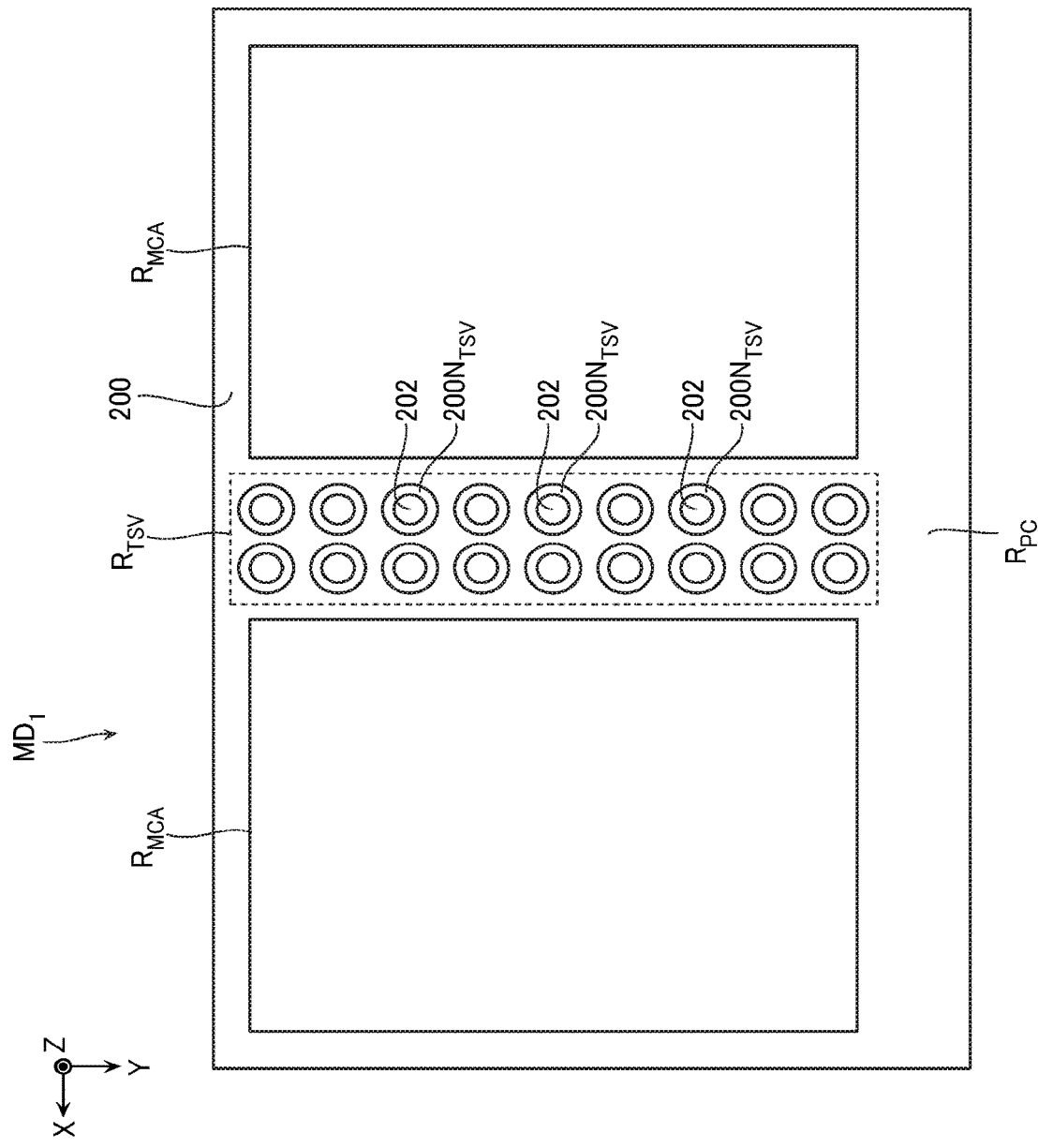
FIG. 4C is a schematic upper surface view showing a configuration example of the memory die $MD_1$.
Figure 5:
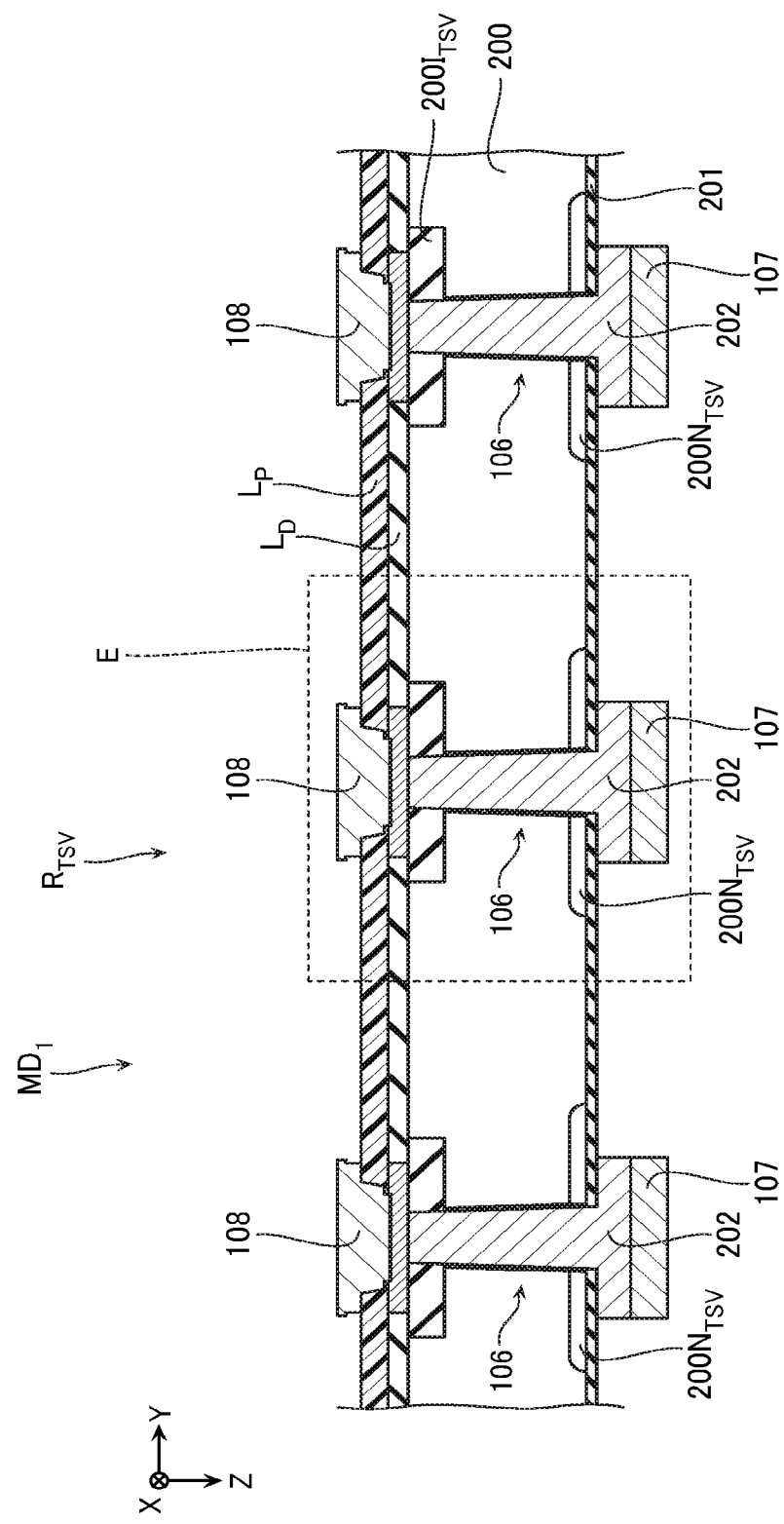
FIG. 5 is a schematic cross-sectional view showing a configuration example of the memory die $MD_1$.

FIG. 4C is a schematic upper surface view showing a configuration example of the memory die MD$_1$. FIG. 4C shows a cross section viewing inverted the configuration shown in FIG. 4A. FIG. 5 is a schematic cross-sectional view showing a configuration example of the memory die MD$_1$. FIG. 5 shows a cross section of the configuration shown in FIG. 4A, taken along the line D-D', looking in the direction of the arrows.

As shown in FIG. 5, the through-electrode region R$_{TSV}$ of the memory die MD$_1$ according to the present embodiment is provided with a plurality of the through-conductive portions 106 that are disposed separated. Moreover, a rear-face (a lower surface in FIG. 5) of the semiconductor substrate 200 is provided with a plurality of the impurity regions 200N$_{TSV}$, correspondingly to these plurality of through-conductive portions 106. These plurality of impurity regions 200N$_{TSV}$ are disposed separated from each other. Moreover, these plurality of impurity regions 200N$_{TSV}$ respectively face outer peripheral surfaces of the substrate through-electrodes 202 via the insulating layer 201. Moreover, as shown in FIG. 4C, these plurality of impurity regions 200N$_{TSV}$ are provided so as to respectively surround along entire peripheries the outer peripheral surfaces of the substrate through-electrodes 202 on the rear-face of the semiconductor substrate 200.

Figure 6:
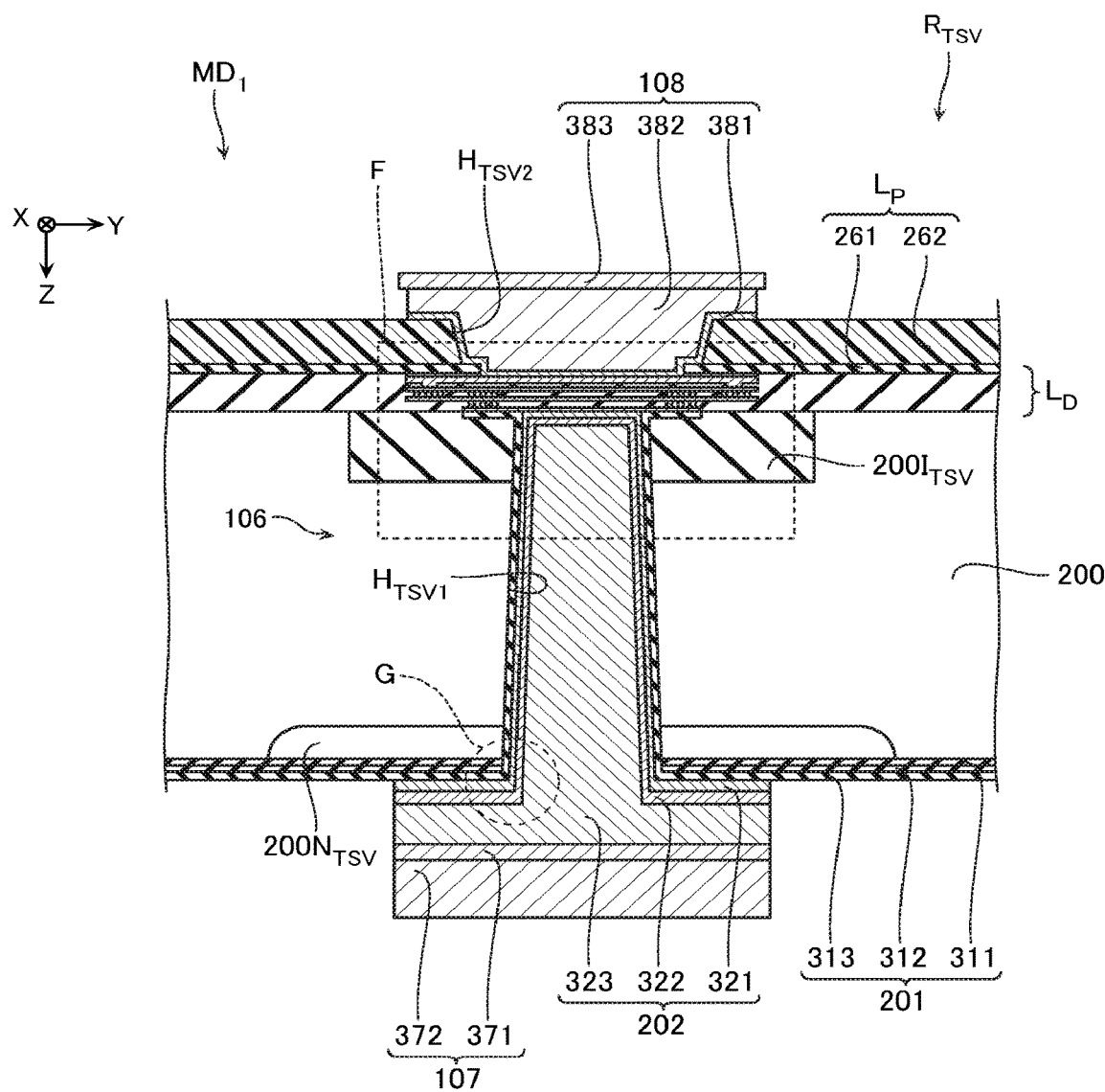
FIG. 6 is a schematic cross-sectional view showing a configuration example of the memory die $MD_1$.
Figure 7:
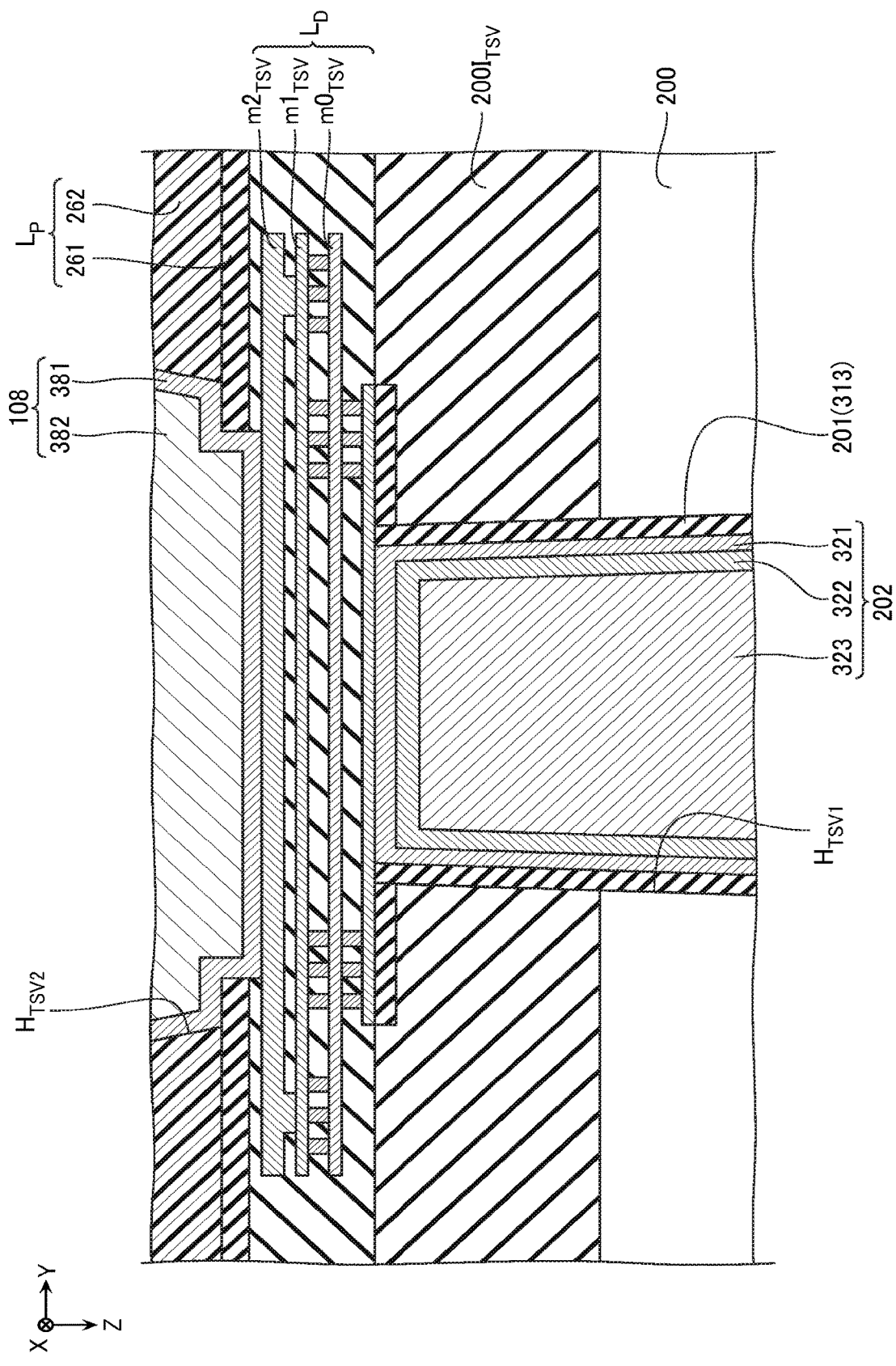
FIG. 7 is a schematic cross-sectional view showing a configuration example of the memory die $MD_1$.

FIGS. 6 and 7 are schematic cross-sectional views showing a configuration example of the memory die MD$_1$. FIG. 6 shows an enlarged view of the portion indicated by E of FIG. 5. FIG. 7 shows an enlarged view of the portion indicated by F of FIG. 6.

As shown in FIG. 6, for example, the insulating layer 201 according to the present embodiment comprises: an insulating layer 311 of the likes of silicon oxide (SiO$_2$); an insulating layer 312 of the likes of silicon nitride (SiN); and an insulating layer 313 of the likes of silicon oxide (SiO$_2$). The insulating layer 311, the insulating layer 312, and the insulating layer 313 are provided on the rear-face of the semiconductor substrate 200. Moreover, the insulating layer 313 is provided on the inner peripheral surface of the through-hole H$_{TSV1}$ provided in the semiconductor substrate 200.

Moreover, as shown in FIG. 6, for example, the substrate through-electrode 202 according to the present embodiment comprises: a barrier conductive layer 321 of the likes of titanium nitride (TiN); a seed layer 322 of the likes of copper (Cu); and a metal layer 323 of the likes of nickel (Ni). These configurations extend in the Z direction along the inner peripheral surface of the through-hole H$_{TSV1}$ provided in the semiconductor substrate 200. Moreover, these configurations are connected to configurations such as the wirings m0$_{TSV}$, m1$_{TSV}$, m2$_{TSV}$ in the device layer L$_D$, as shown in FIG. 7, for example.

Moreover, as shown in FIG. 6, for example, the rear-face electrode 107 according to the present embodiment comprises: a base metal layer 371 of the likes of copper (Cu); and a bump electrode 372 including the likes of tin (Sn). These configurations are provided on a surface on a rear-face side (a lower surface in FIG. 6) of the memory die MD$_1$ of the substrate through-electrode 202.

Moreover, as shown in FIG. 6, for example, the front-face electrode 108 according to the present embodiment comprises: a barrier conductive layer 381 of the likes of titanium nitride (TiN); a bump electrode 382 including the likes of nickel (Ni); and a metal layer 383 of the likes of gold (Au). The barrier conductive layer 381 is provided along an inner peripheral surface and bottom surface of the through-hole H$_{TSV2}$. The bump electrode 382 is embedded inside the through-hole H$_{TSV2}$. The metal layer 383 covers an upper surface in FIG. 6, of the bump electrode 382.

Next, a manufacturing method of the memory die MD$_1$ according to the present embodiment will be described with reference to FIGS. 8 to 17. FIGS. 8 to 17 are schematic cross-sectional views for explaining same manufacturing method. FIGS. 8 to 12 show a portion corresponding to FIG. 5. FIGS. 13 to 17 shown a portion corresponding to FIG. 6.

Figure 8:
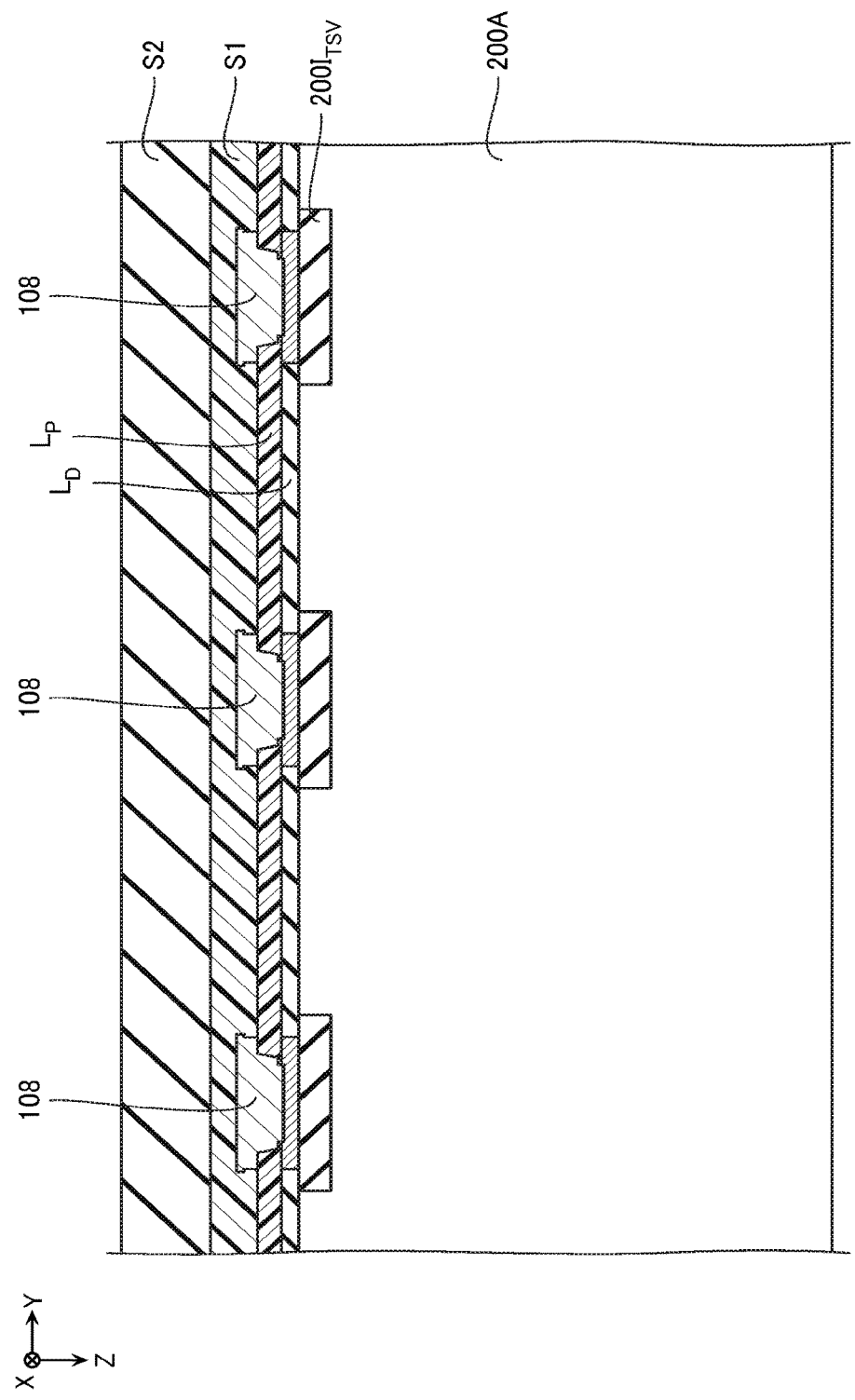
FIG. 8 is a schematic cross-sectional view for explaining a manufacturing method of the memory die $MD_1$.

A structure shown in FIG. 8 comprises: a semiconductor substrate 200A; the device layer L$_D$ provided on a front-face of the semiconductor substrate 200A; the surface-side protective layer L$_P$ provided on the front-face of the device layer L$_D$; the front-face electrode 108 provided in the front-face-side protective layer L$_P$; an adhesive agent layer S1 covering the front-face-side protective layer L$_P$ and the front-face electrode 108; and a supporting substrate S2 connected to the front-face-side protective layer L$_P$ and the front-face electrode 108 via the adhesive agent layer S1. The semiconductor substrate 200A is basically configured similarly to the semiconductor substrate 200 described with reference to FIG. 4A, and so on. However, the semiconductor substrate 200A has a larger thickness than the semiconductor substrate 200. Moreover, the semiconductor substrate 200A does not have its rear-face provided with the impurity region 200N$_{TSV}$. Moreover, the semiconductor substrate 200A is not provided with the through-hole H$_{TSV1}$.

Figure 9:
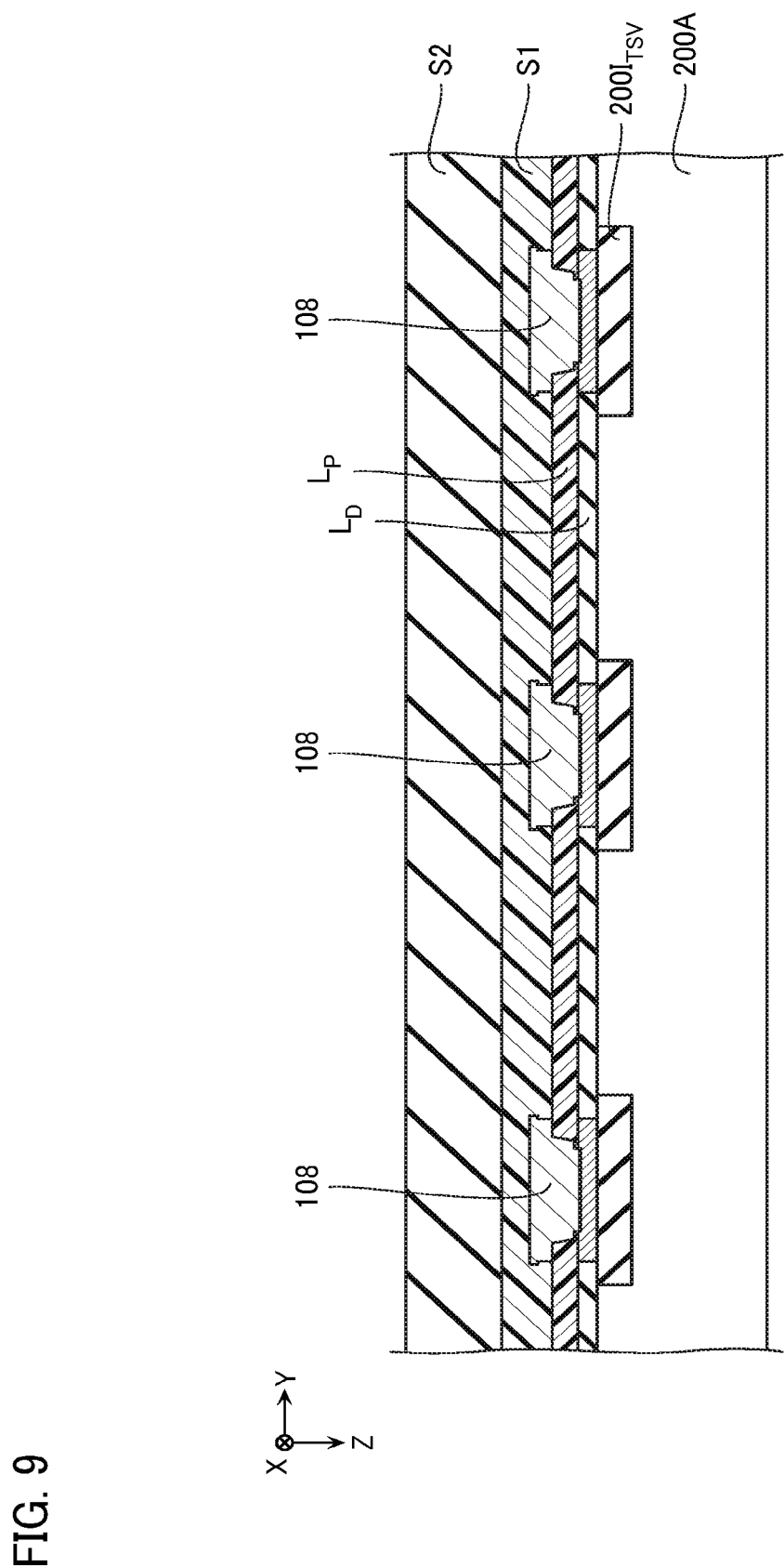
FIG. 9 is a schematic cross-sectional view for explaining the manufacturing method of the memory die $MD_1$.

In the manufacturing method according to the present embodiment, as shown in FIG. 9, part of the rear-face of the semiconductor substrate 200A is removed, and thickness in the Z direction of the semiconductor substrate 200A is reduced.

Figure 10:
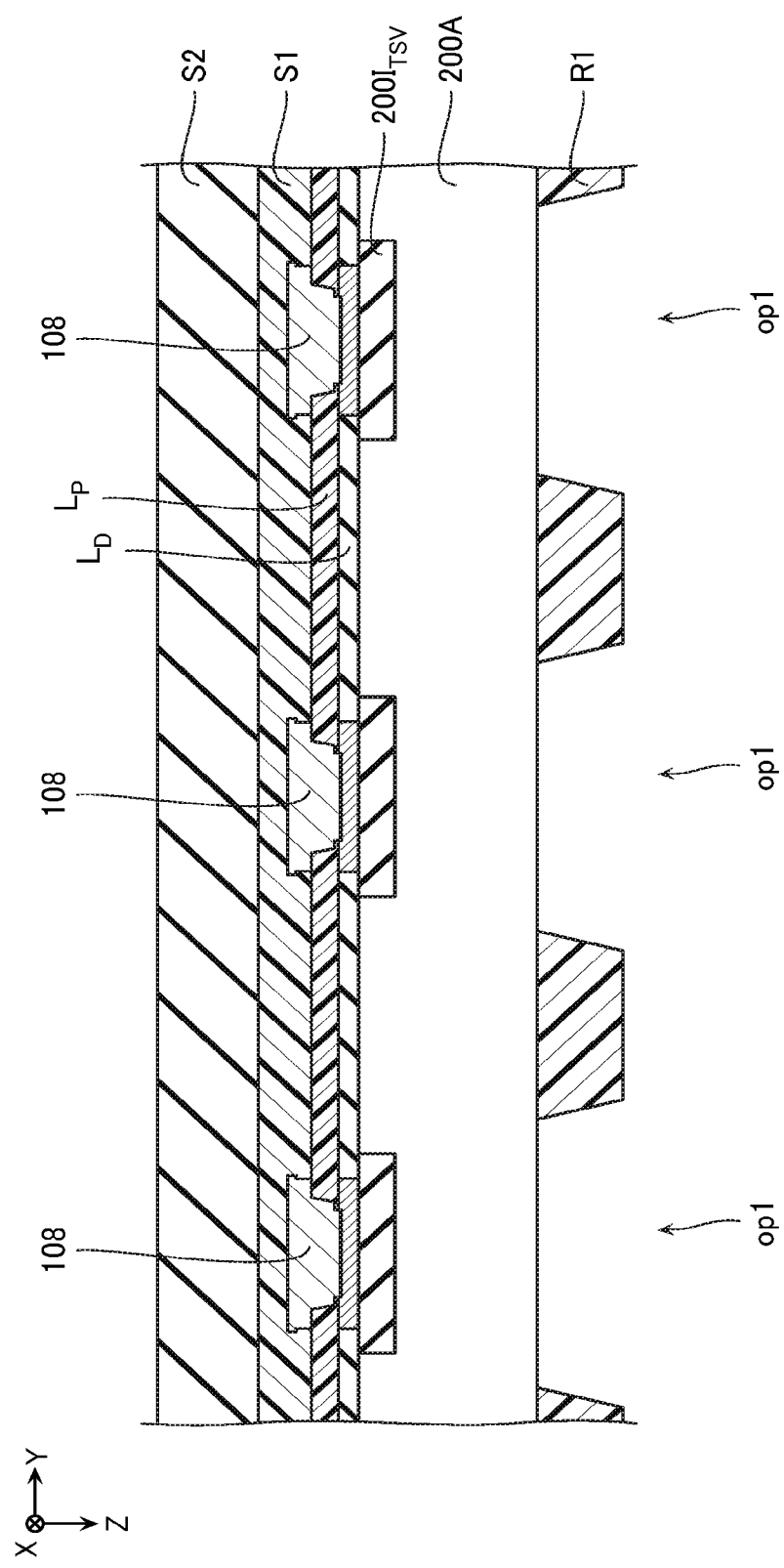
FIG. 10 is a schematic cross-sectional view for explaining the manufacturing method of the memory die $MD_1$.

Next, as shown in FIG. 10, the rear-face of the semiconductor substrate 200A is coated with a resist R1. In addition, patterning is performed by a method such as photolithography, and an opening op1 is formed in the resist R1.

Figure 11:
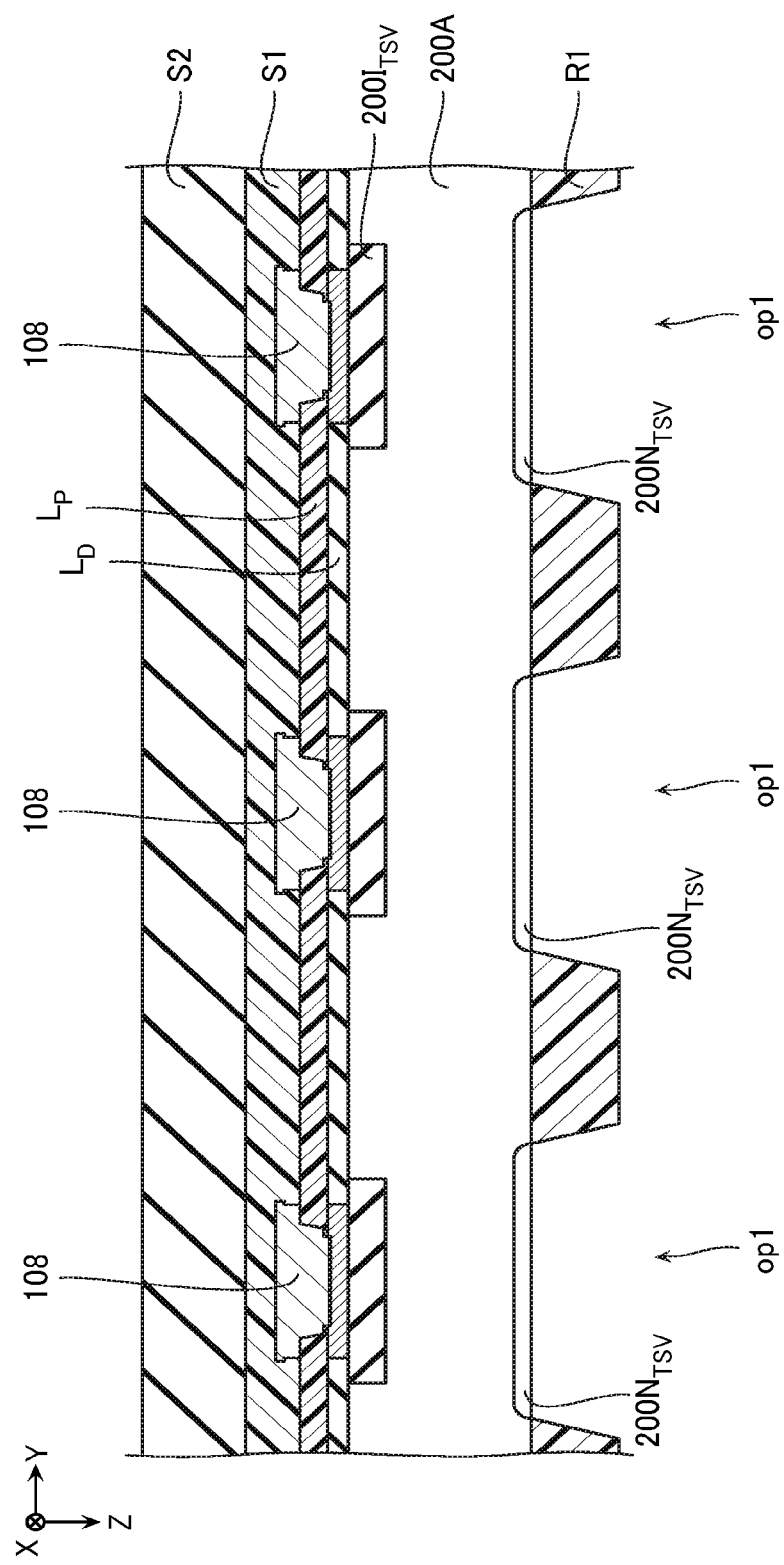
FIG. 11 is a schematic cross-sectional view for explaining the manufacturing method of the memory die $MD_1$.

Next, as shown in FIG. 11, the rear-face of the semiconductor substrate 200A is implanted with phosphorus (P), arsenic (As), or another N type impurity, via the opening op1. As a result, the impurity region 200N$_{TSV}$ is formed in the rear-face of the semiconductor substrate 200A.

Figure 12:
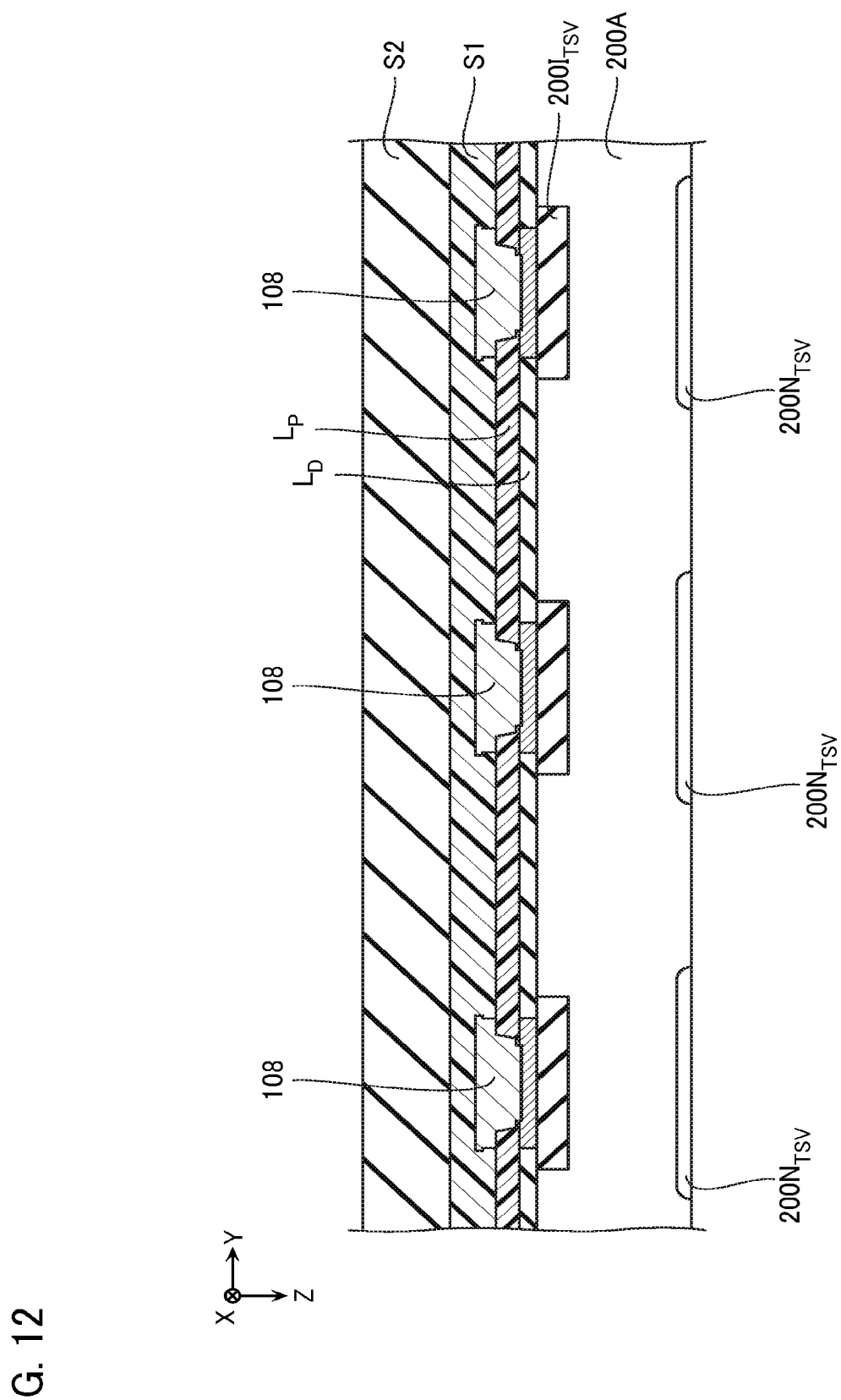
FIG. 12 is a schematic cross-sectional view for explaining the manufacturing method of the memory die $MD_1$.

Next, as shown in FIG. 12, the resist R1 is removed.

Figure 13:
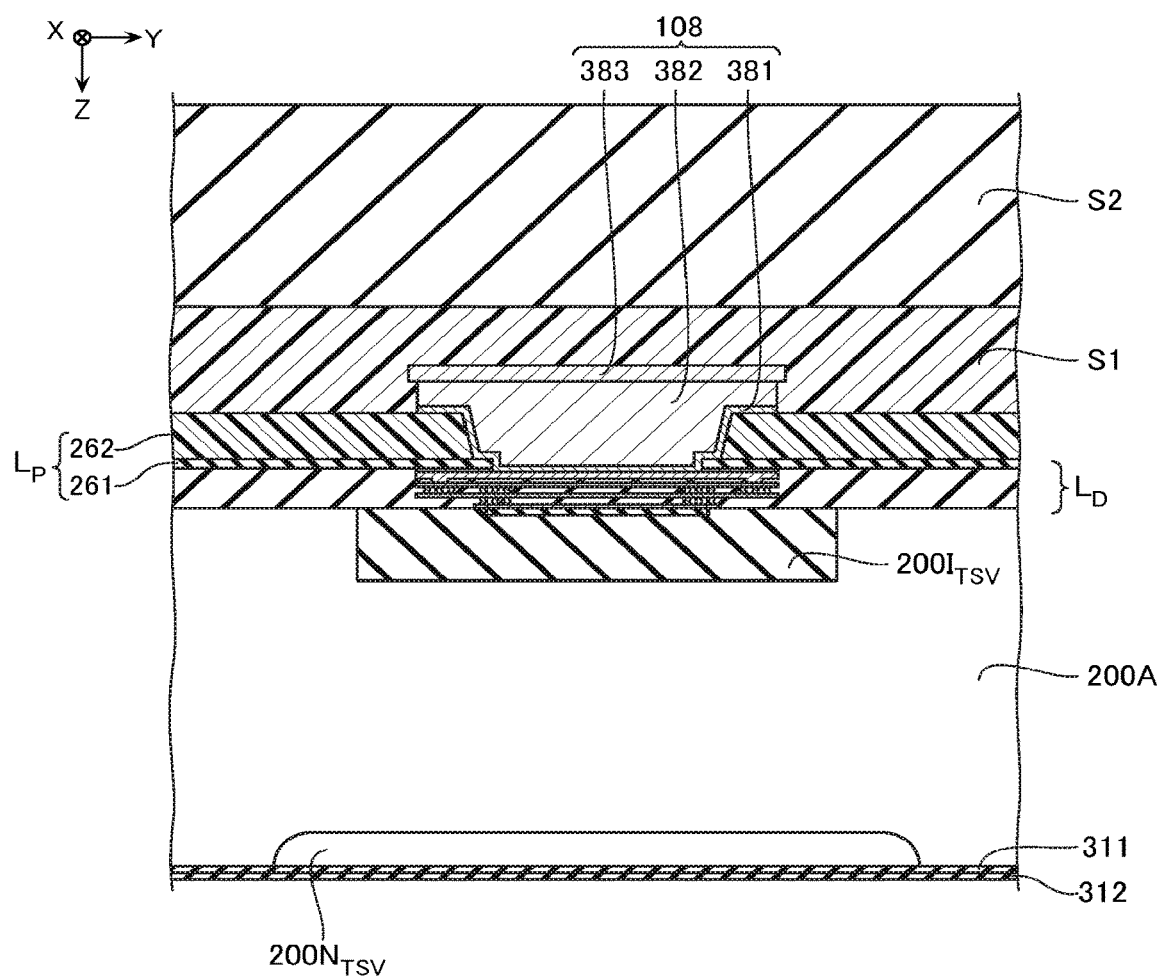
FIG. 13 is a schematic cross-sectional view for explaining the manufacturing method of the memory die $MD_1$.

Next, as shown in FIG. 13, the insulating layer 311 and the insulating layer 312 are formed on the rear-face of the semiconductor substrate 200A. This step is performed by a method such as CVD (Chemical Vapor Deposition), for example.

Figure 14:
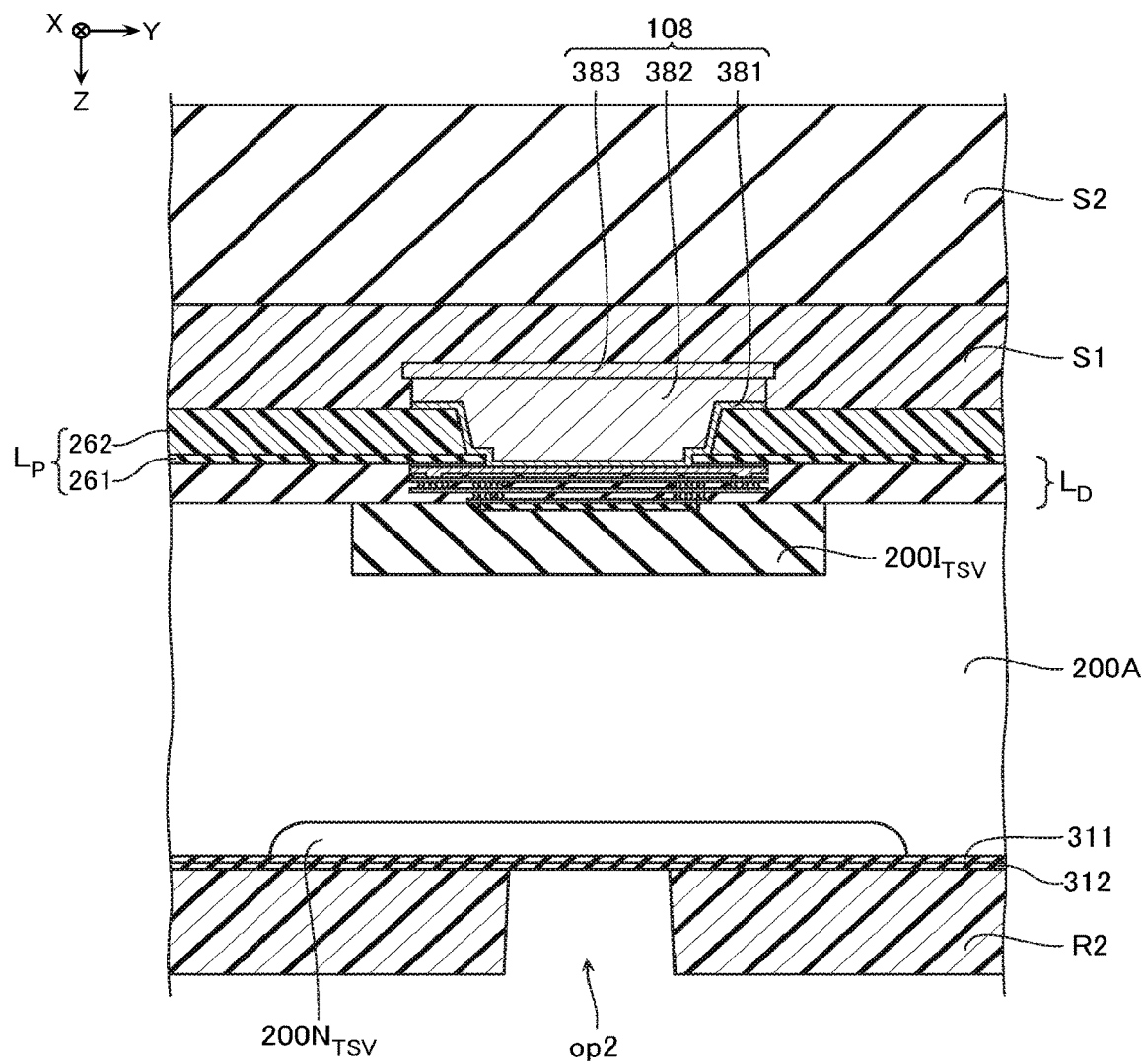
FIG. 14 is a schematic cross-sectional view for explaining the manufacturing method of the memory die $MD_1$.

Next, as shown in FIG. 14, the rear-face of the semiconductor substrate 200A is coated with a resist R2. In addition, patterning is performed by a method such as photolithography, and an opening op2 is formed in the resist R2.

Figure 15:
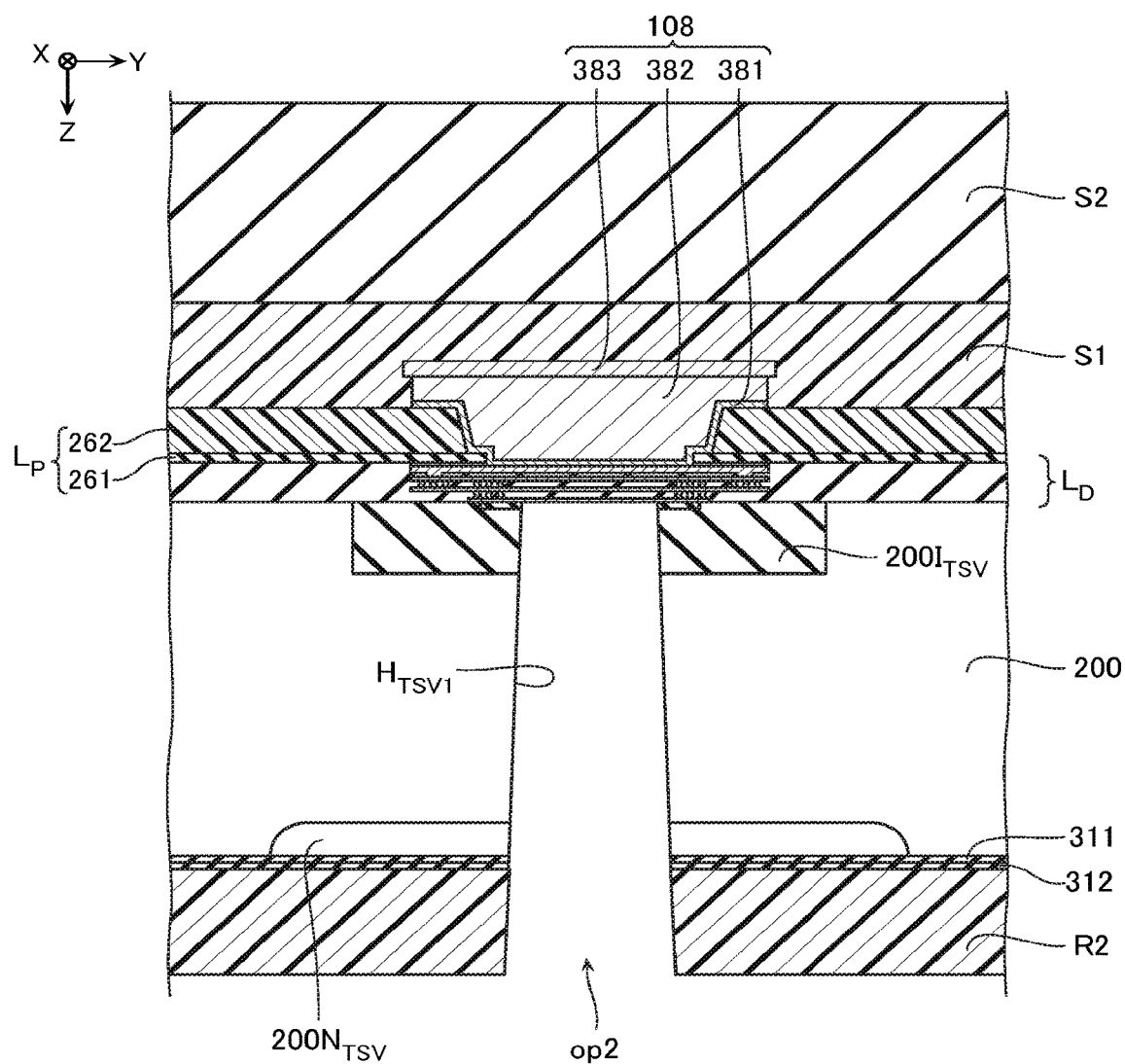
FIG. 15 is a schematic cross-sectional view for explaining the manufacturing method of the memory die $MD_1$.

Next, as shown in FIG. 15, the through-hole $H_{TSV1}$ is formed in the semiconductor substrate 200A via the opening op2. This step is performed by a method such as RIE (Reactive Ion Etching), for example. This step results in the semiconductor substrate 200 being formed.

Figure 16:
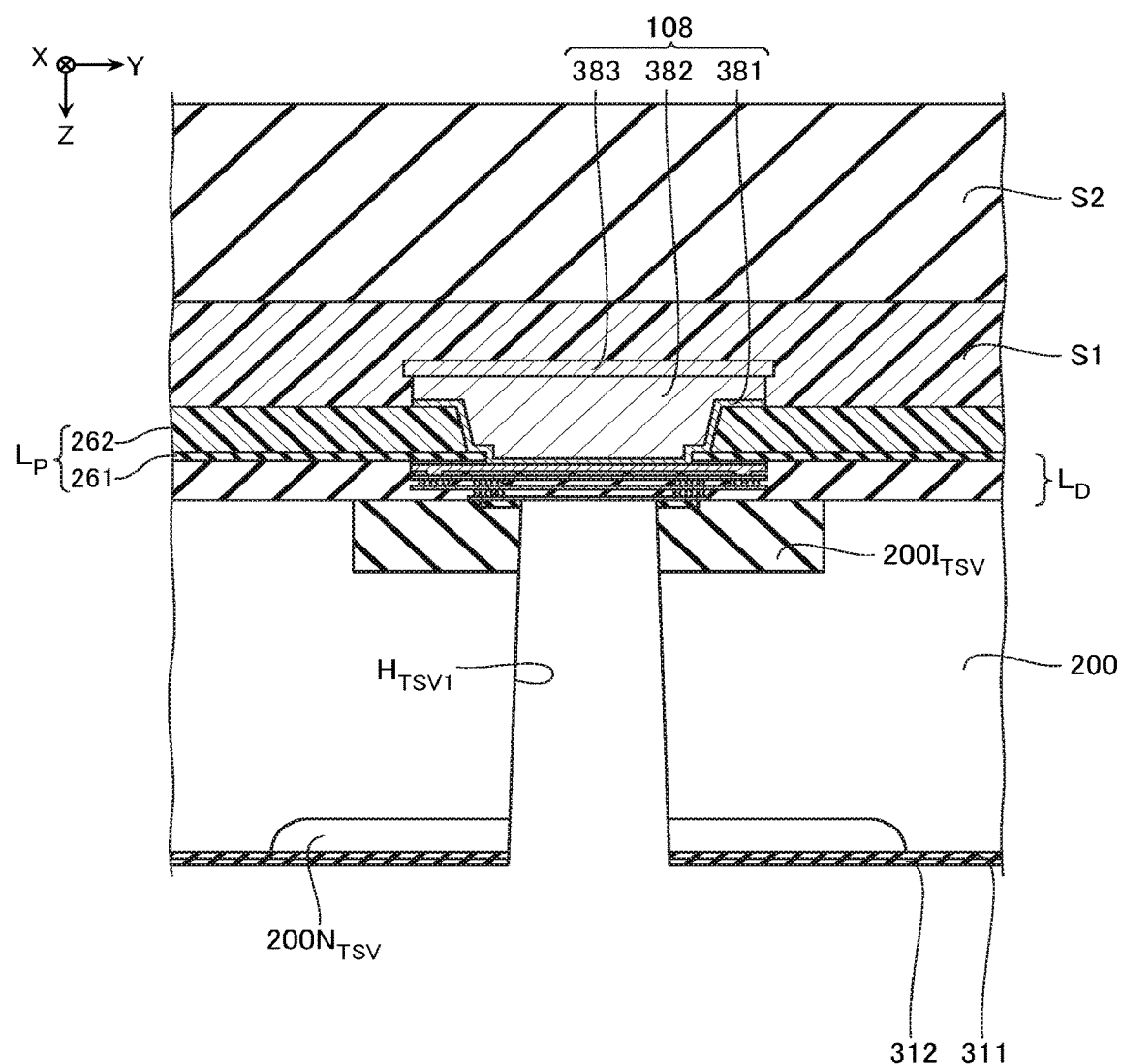
FIG. 16 is a schematic cross-sectional view for explaining the manufacturing method of the memory die $MD_1$.

Next, as shown in FIG. 16, the resist R2 is removed.

Figure 17:
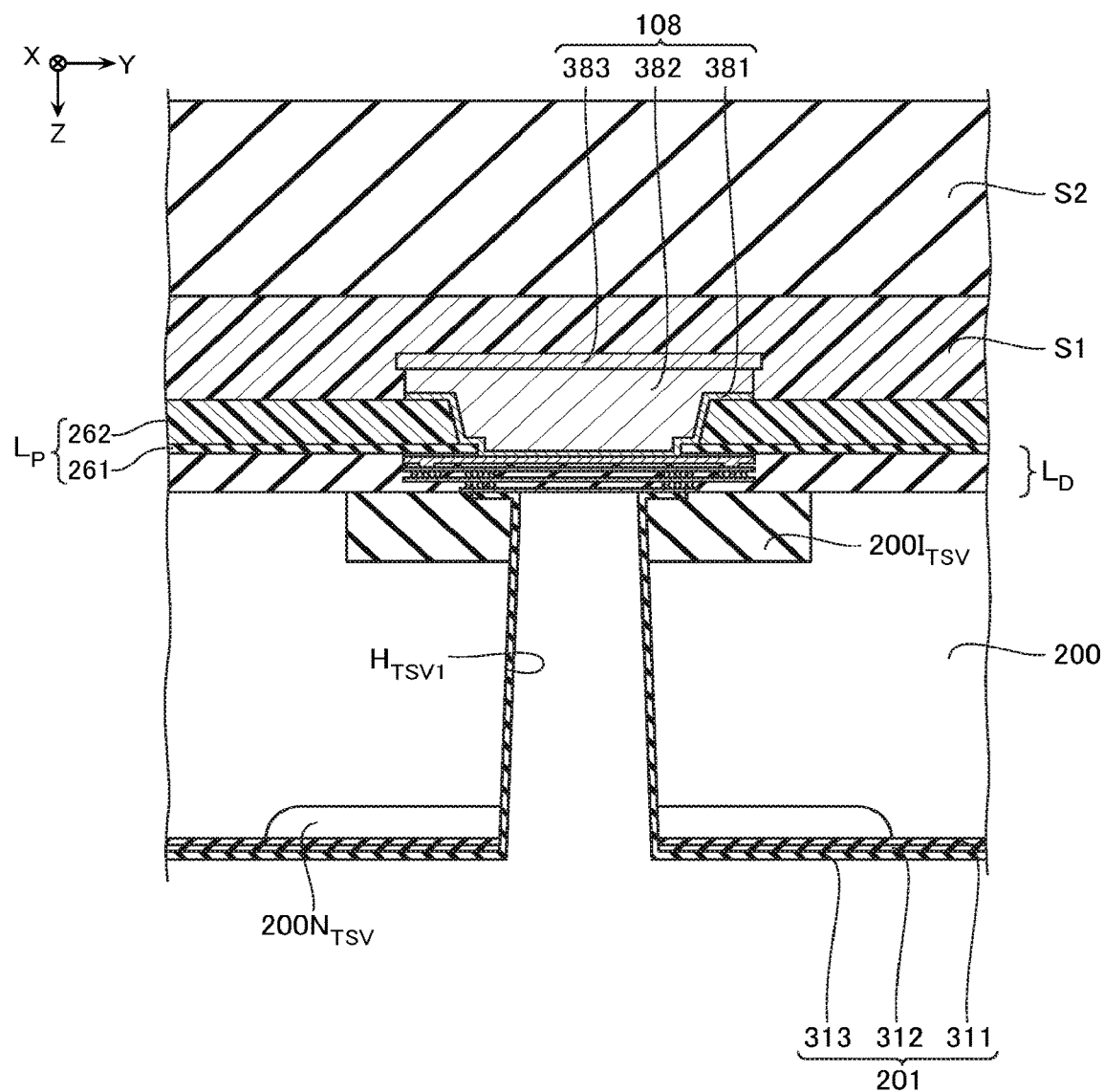
FIG. 17 is a schematic cross-sectional view for explaining the manufacturing method of the memory die $MD_1$.

Next, as shown in FIG. 17, the insulating layer 313 is formed on a surface (a lower surface in FIG. 17) of the insulating layer 312, and on the inner peripheral surface and bottom surface of the through-hole $H_{TSV1}$. This step is performed by a method such as CVD, for example. This step results in the insulating layer 201 being formed.

Subsequently, the substrate through-electrode 202 (FIG. 6) is formed on the inside of the through-hole $H_{TSV1}$, and the rear-face electrode 107 is formed on one end (a lower surface in FIG. 6) of the substrate through-electrode 202, whereby the memory die $MD_1$ of the kind described with reference to FIGS. 4A to 7 is formed. Moreover, a plurality of the formed memory dies $MD_1$ are stacked on the supporting substrate 101 (FIG. 3), and these configurations are mounted on the mounting substrate 103 (FIG. 3) and sealed by the resin member 119 (FIG. 3), whereby the memory system 10 of the kind described with reference to FIG. 3 is formed.

Now, sometimes, in the manufacturing steps of such a memory system 10, a crack occurs in a portion provided in a vicinity of a boundary of the rear-face of the semiconductor substrate 200 and the through-hole $H_{TSV1}$, of the insulating layer 313 (FIG. 6) (a portion indicated by G of FIG. 6). Now, in the case where, for example, the semiconductor substrate 200 has been supplied with the ground voltage $V_{SS}$ and the substrate through-electrode 202 has been supplied with a voltage which is larger than the ground voltage $V_{SS}$, there is a risk that a leak current occurs between the semiconductor substrate 200 and the substrate through-electrode 202.

Accordingly, in the present embodiment, the N type impurity region $200N_{TSV}$ is provided in the vicinity of the boundary of the rear-face of the semiconductor substrate 200 and the through-hole $H_{TSV1}$. Such a configuration results in that, even if a crack occurs in the above-described portion of the insulating layer 313, it is possible for the above-described leak current to be suppressed due to the impurity region $200N_{TSV}$ and another portion of the semiconductor substrate 200 being electrically isolated by a depletion layer.

Moreover, in the present embodiment, as described with reference to FIGS. 4C and 5, for example, the rear-face of the semiconductor substrate 200 is provided with a plurality of the impurity regions $200N_{TSV}$ corresponding to the plurality of substrate through-electrodes 202. Such a configuration results in that, even in the case where, for example, a crack of the insulating layer 313 has occurred in a vicinity of the substrate through-electrode 202 supplied with the ground voltage $V_{SS}$, and a crack of the insulating layer 313 has occurred in a vicinity of the substrate through-electrode 202 supplied with the power supply voltage $V_{CC}$ or the power supply voltage $V_{CCQ}$, each of the impurity regions $200N_{TSV}$ can be set to an electrically independent state. This makes it possible for a leak current between the substrate through-electrodes 202 to be suppressed.

Second Embodiment

Figure 18:
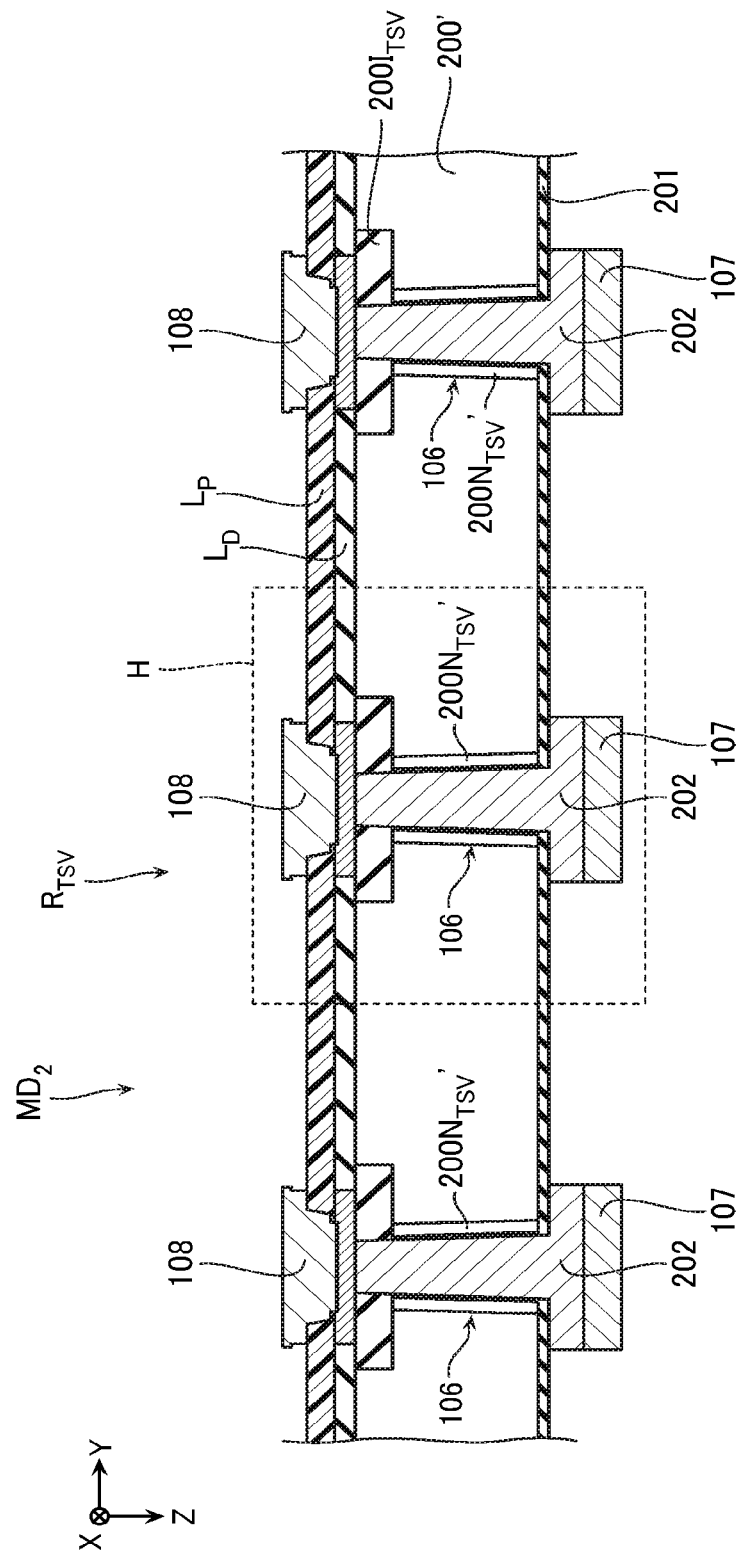
FIG. 18 is a schematic cross-sectional view showing a configuration example of a memory die $MD_2$ according to a second embodiment.
Figure 19:
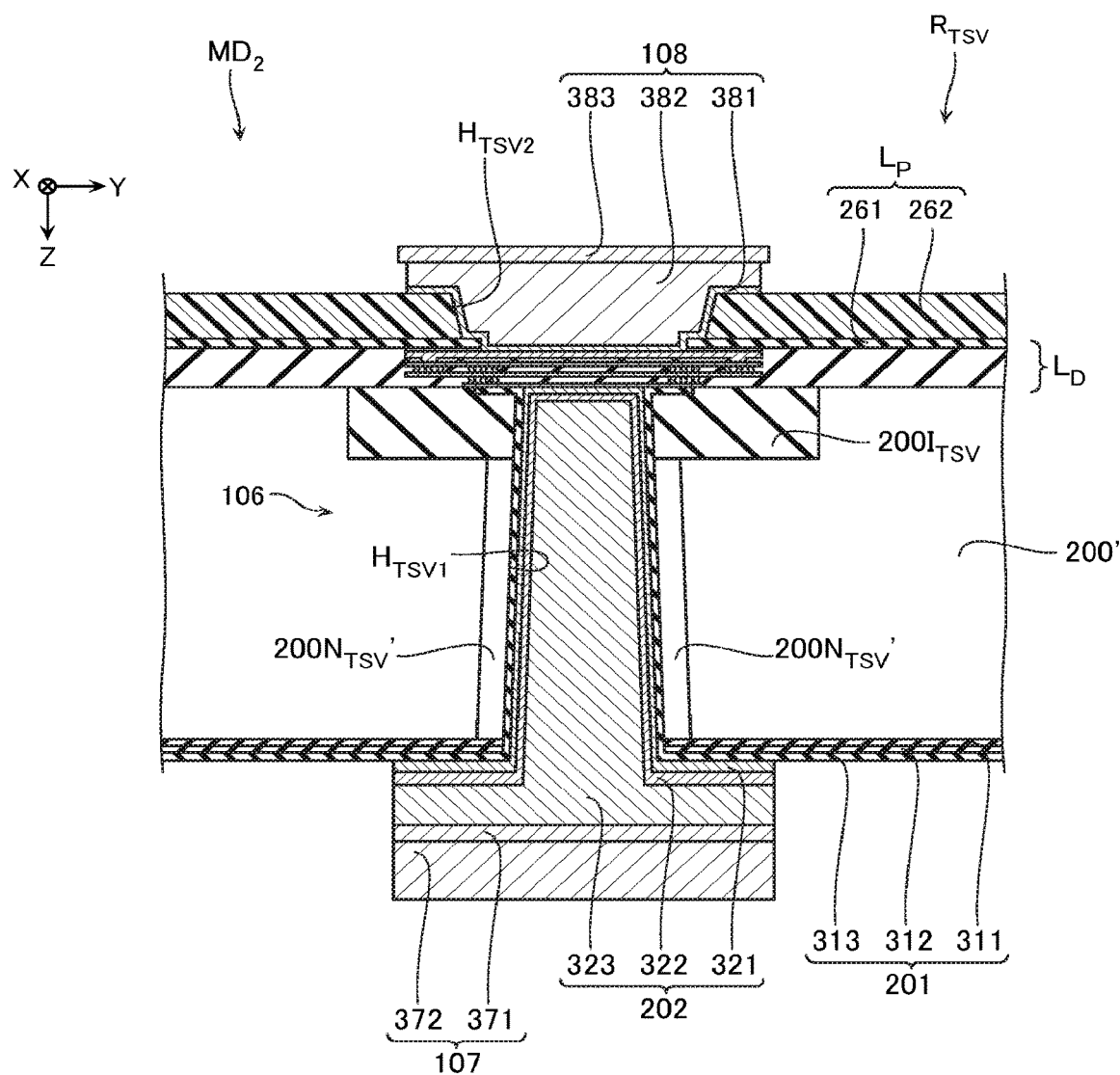
FIG. 19 is a schematic cross-sectional view showing a configuration example of the memory die $MD_2$.

FIGS. 18 and 19 are schematic cross-sectional views showing a configuration example of a memory system according to a second embodiment. FIG. 19 shows an enlarged view of the portion indicated by H of FIG. 18.

The memory system according to the present embodiment is basically configured similarly to the memory system 10 according to the first embodiment. However, the memory system according to the present embodiment comprises a memory die $MD_2$ instead of the memory die $MD_1$. The memory die $MD_2$ is basically configured similarly to the memory die $MD_1$. However, the memory die $MD_2$ according to the present embodiment comprises a semiconductor substrate 200' instead of the semiconductor substrate 200. The semiconductor substrate 200' according to the present embodiment is basically configured similarly to the semiconductor substrate 200. However, the semiconductor substrate 200' according to the present embodiment does not have its rear-face provided with the impurity region $200N_{TSV}$. Moreover, the inner peripheral surface of the through-hole $H_{TSV1}$ formed in the semiconductor substrate 200' according to the present embodiment is provided with an impurity region $200N_{TSV}'$. The impurity region $200N_{TSV}'$ extends in the Z direction along the inner peripheral surface of the through-hole $H_{TSV1}$. Note that this impurity region $200N_{TSV}'$ extends in the Z direction along the outer peripheral surface of the substrate through-electrode 202.

Next, a manufacturing method of the memory die $MD_2$ according to the present embodiment will be described with reference to FIGS. 20 to 26. FIGS. 20 to 26 are schematic cross-sectional views for explaining same manufacturing method. FIGS. 20 to 26 show a portion corresponding to FIG. 19.

The manufacturing method according to the present embodiment is basically similar to the manufacturing method according to the first embodiment up to the step described with reference to FIG. 9.

Figure 20:
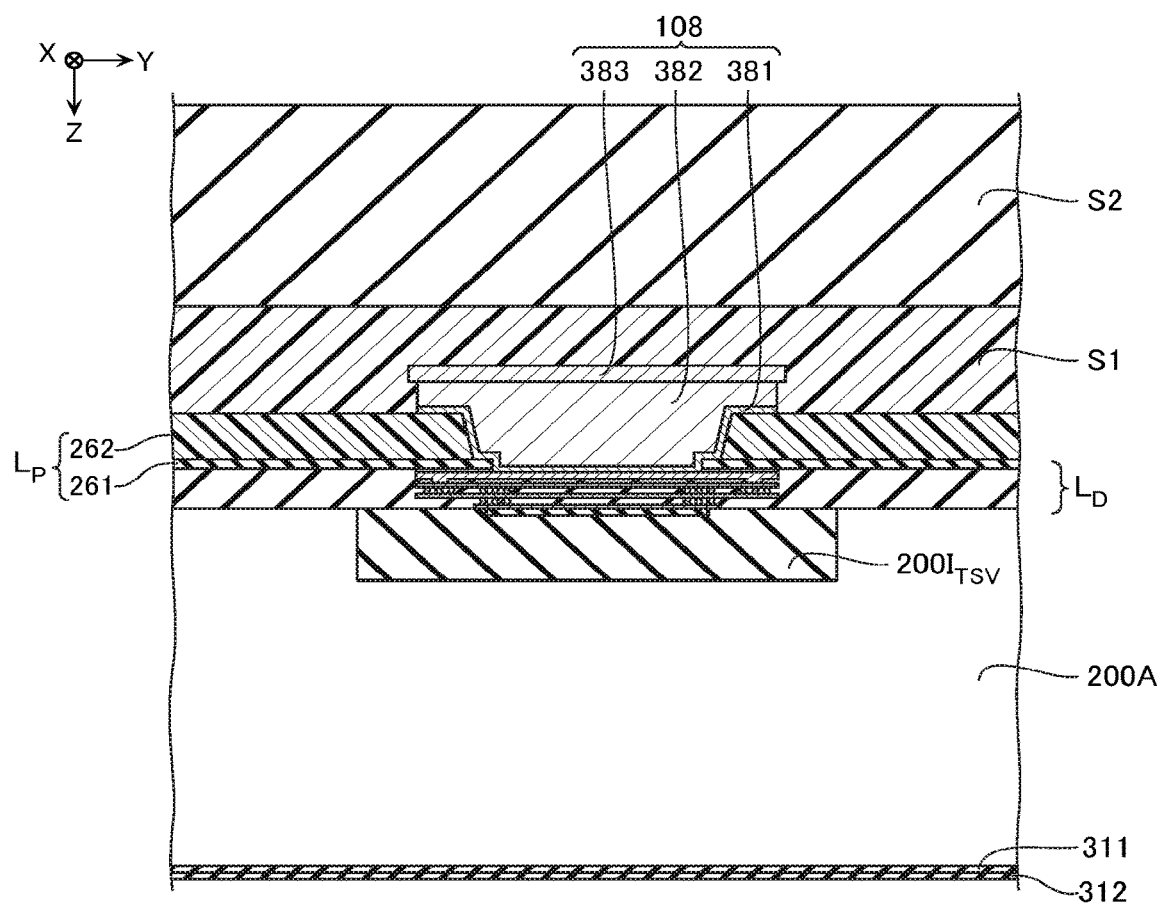
FIG. 20 is a schematic cross-sectional view for explaining a manufacturing method of the memory die $MD_2$.

In the manufacturing method according to the present embodiment, as shown in FIG. 20, the insulating layer 311 and the insulating layer 312 are formed on the rear-face of the semiconductor substrate 200A. This step is performed by a method such as CVD, for example.

Figure 21:
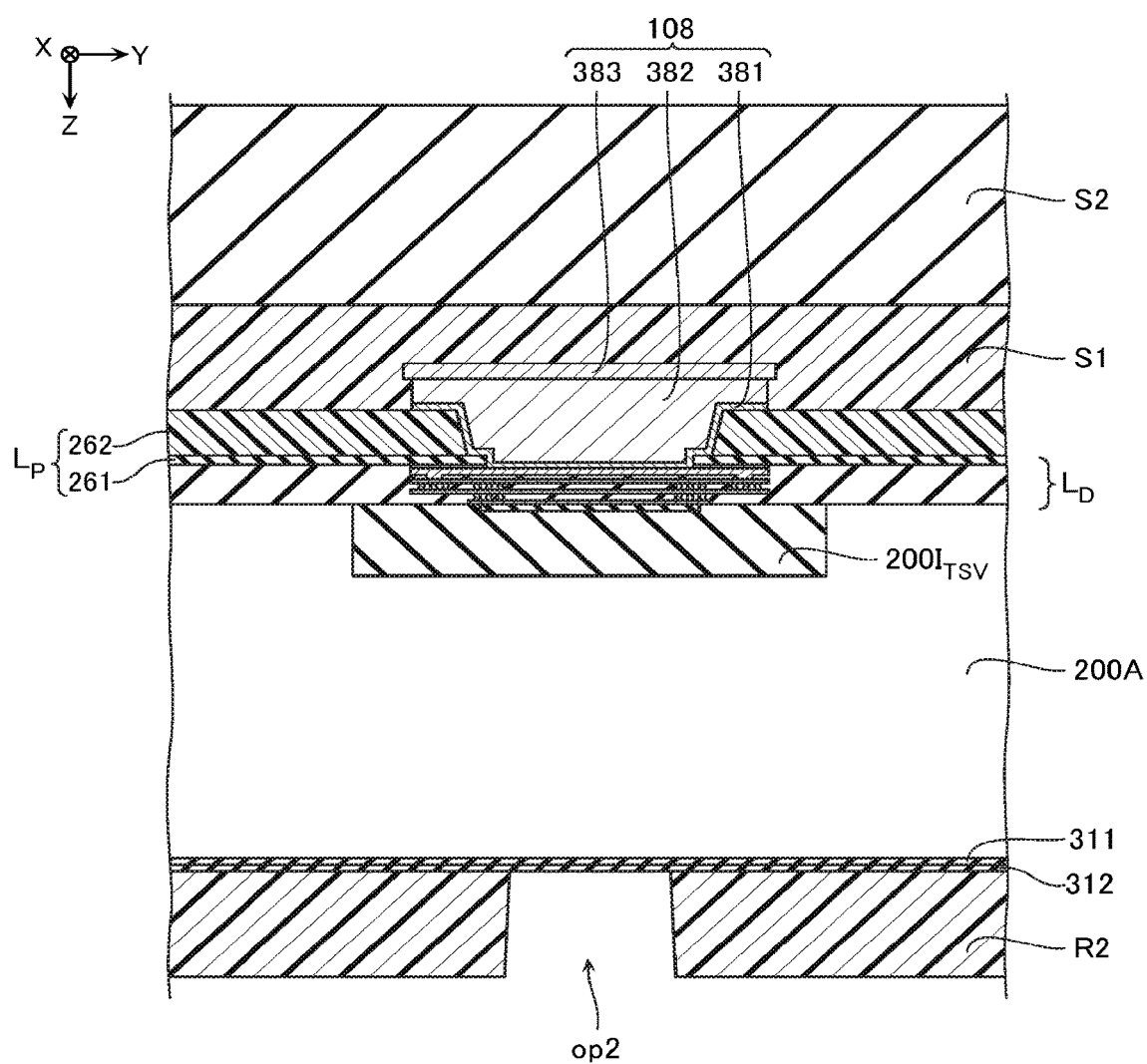
FIG. 21 is a schematic cross-sectional view for explaining the manufacturing method of the memory die $MD_2$.

Next, as shown in FIG. 21, the rear-face of the semiconductor substrate 200A is coated with the resist R2. In addition, patterning is performed by a method such as photolithography, and the opening op2 is formed in the resist R2.

Figure 22:
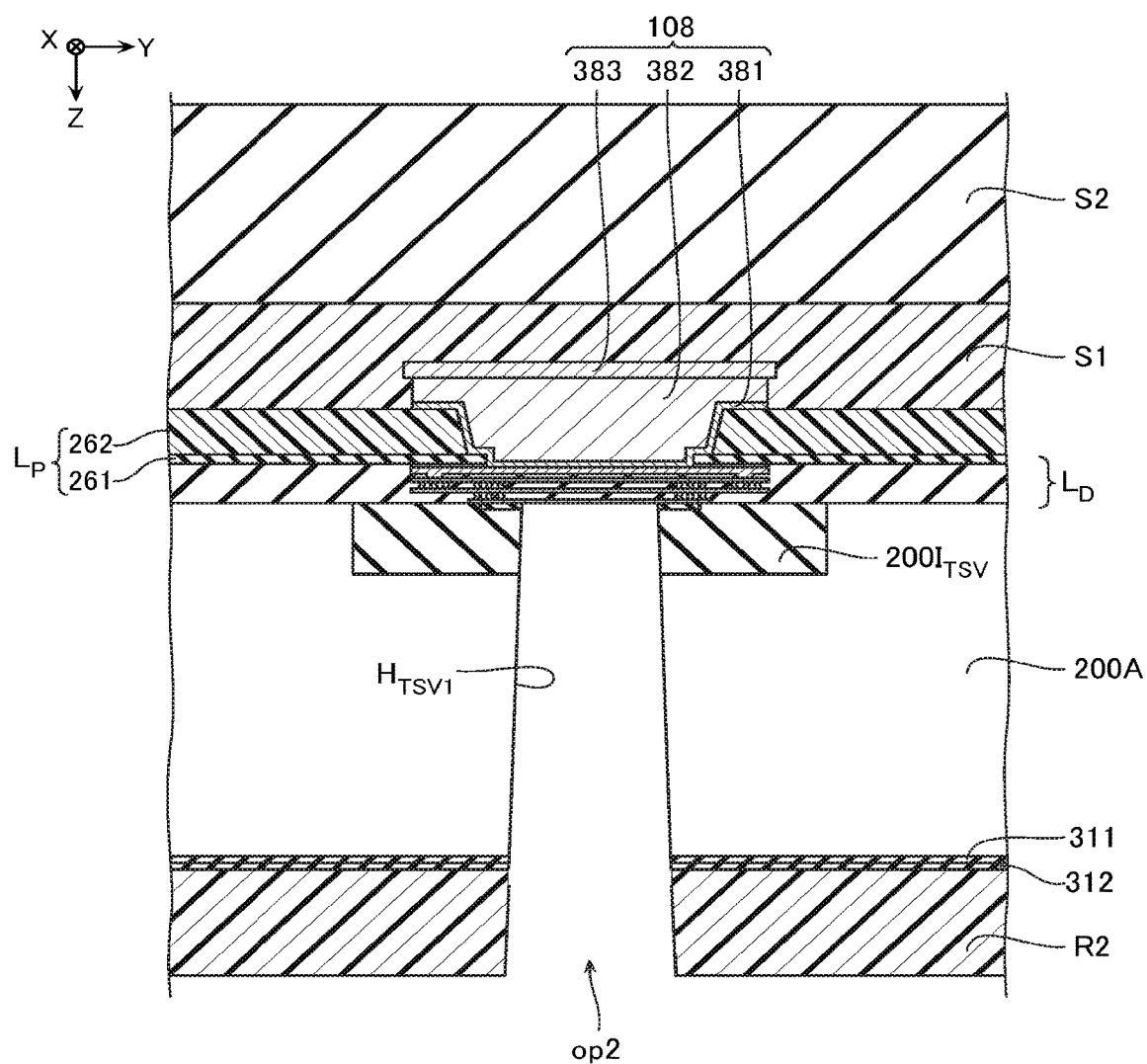
FIG. 22 is a schematic cross-sectional view for explaining the manufacturing method of the memory die $MD_2$.

Next, as shown in FIG. 22, the through-hole $H_{TSV1}$ is formed in the semiconductor substrate 200A via the opening op2. This step is performed by a method such as RIE, for example.

Figure 23:
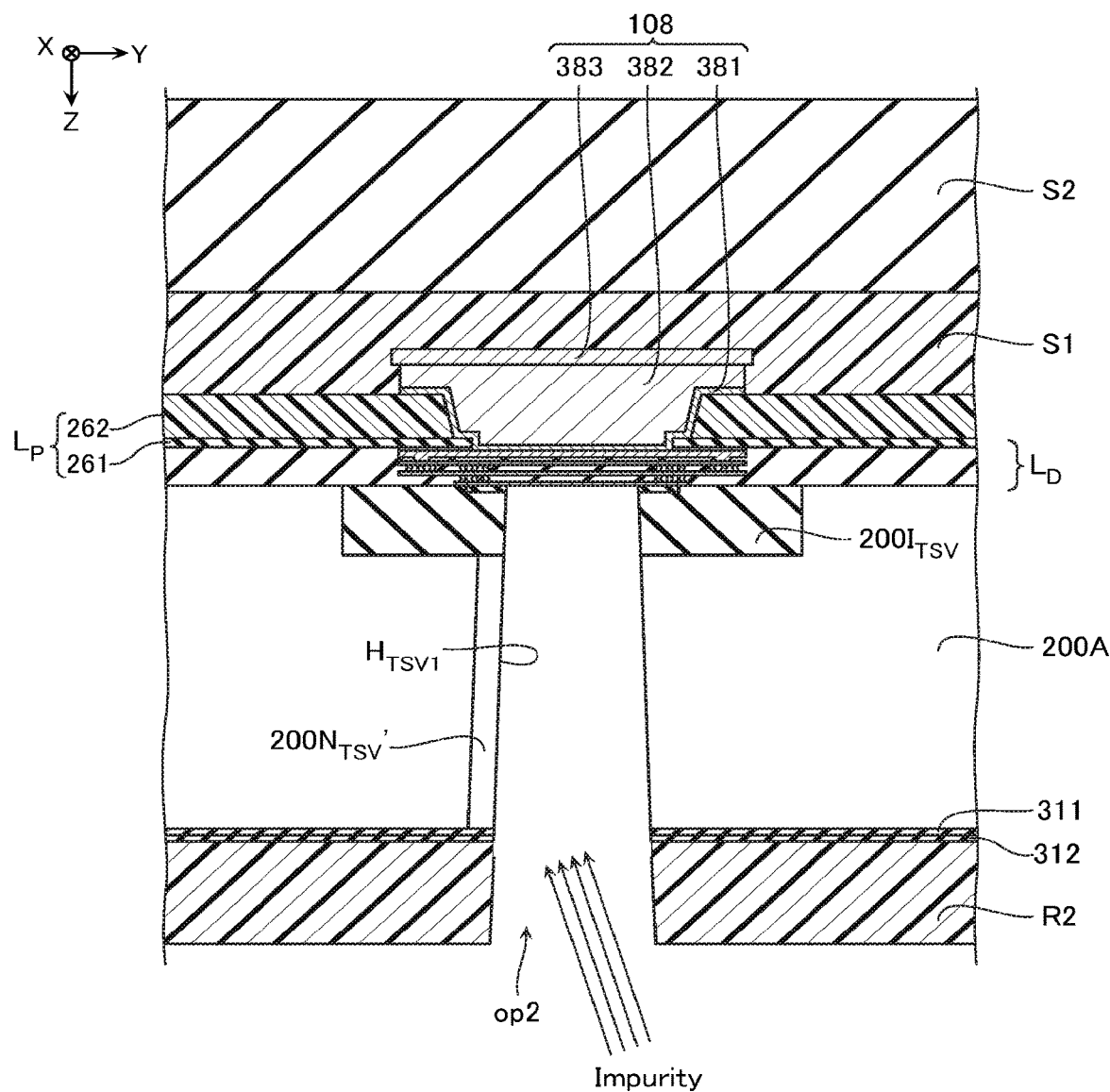
FIG. 23 is a schematic cross-sectional view for explaining the manufacturing method of the memory die $MD_2$.
Figure 24:
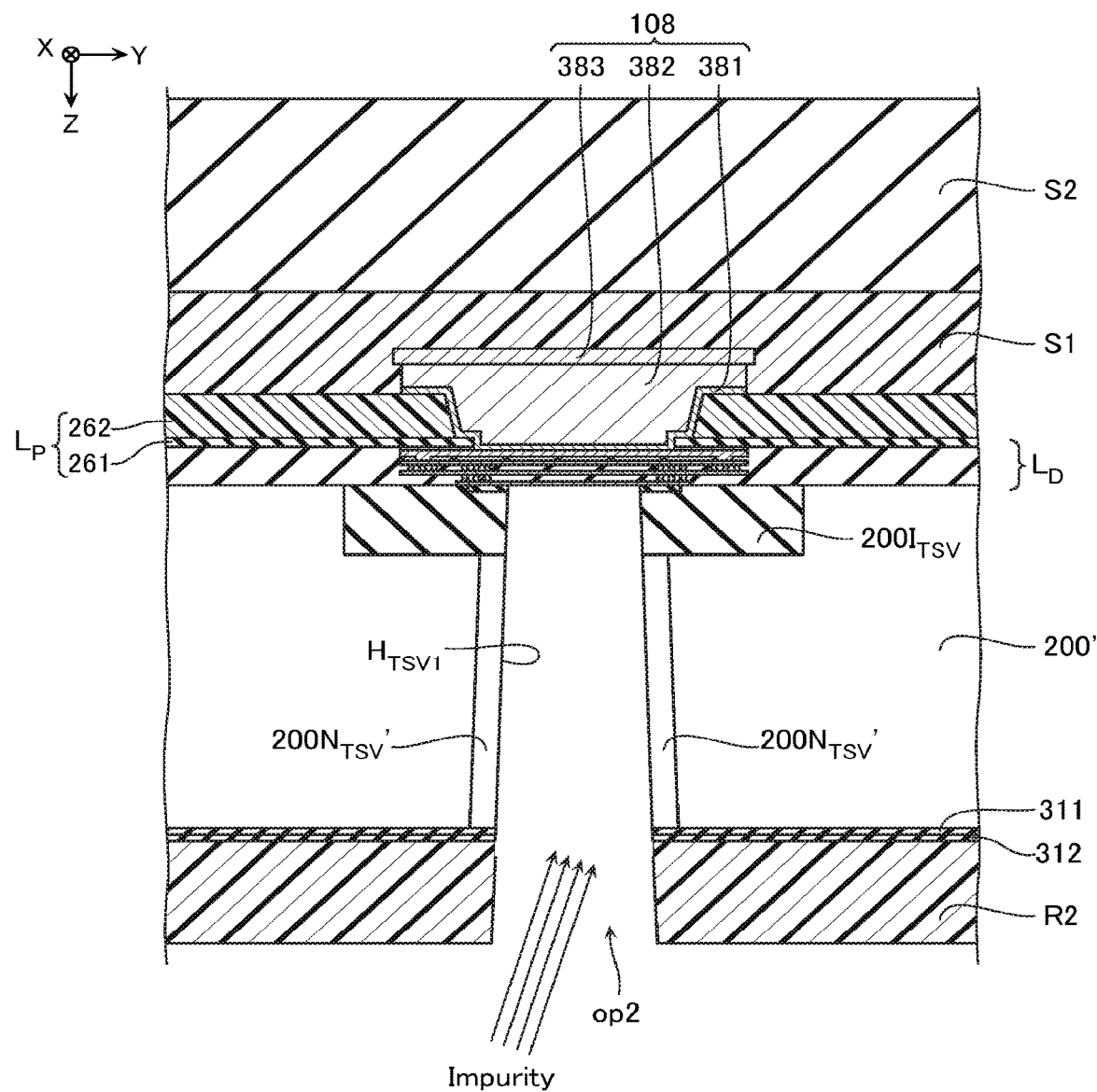
FIG. 24 is a schematic cross-sectional view for explaining the manufacturing method of the memory die $MD_2$.

Next, as shown in FIGS. 23 and 24, the inner peripheral surface of the through-hole $H_{TSV1}$ is implanted with phosphorus (P), arsenic (As), or another N type impurity, via the opening op2. In this step, the impurity is implanted from directions oblique to the rear-surface of the semiconductor substrate 200A (directions intersecting the Z direction). In this step, a step for implanting the impurity, and a step for rotating the semiconductor substrate 200A around the Z axis, may be alternately performed a plurality of times each, for example. Moreover, in this step, the impurity may be implanted while the semiconductor substrate 200A is rotated around the Z axis, for example. This step results in the semiconductor substrate 200' being formed.

Figure 25:
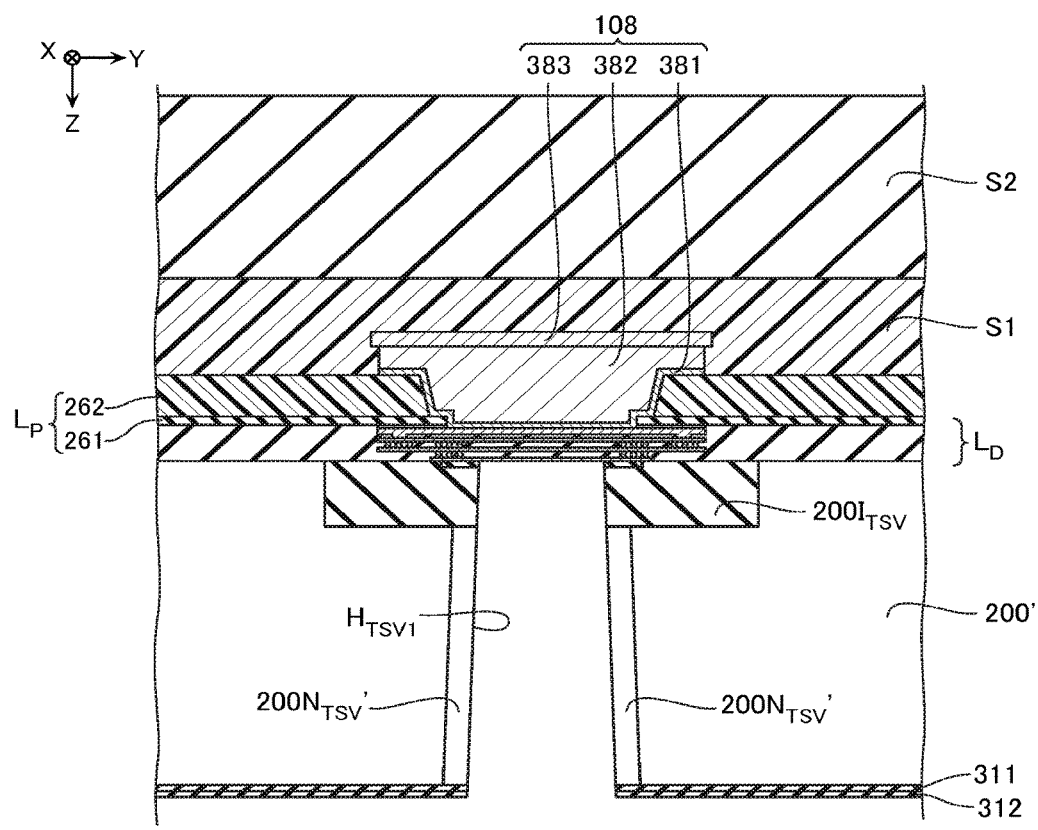
FIG. 25 is a schematic cross-sectional view for explaining the manufacturing method of the memory die $MD_2$.

Next, as shown in FIG. 25, the resist R2 is removed.

Figure 26:
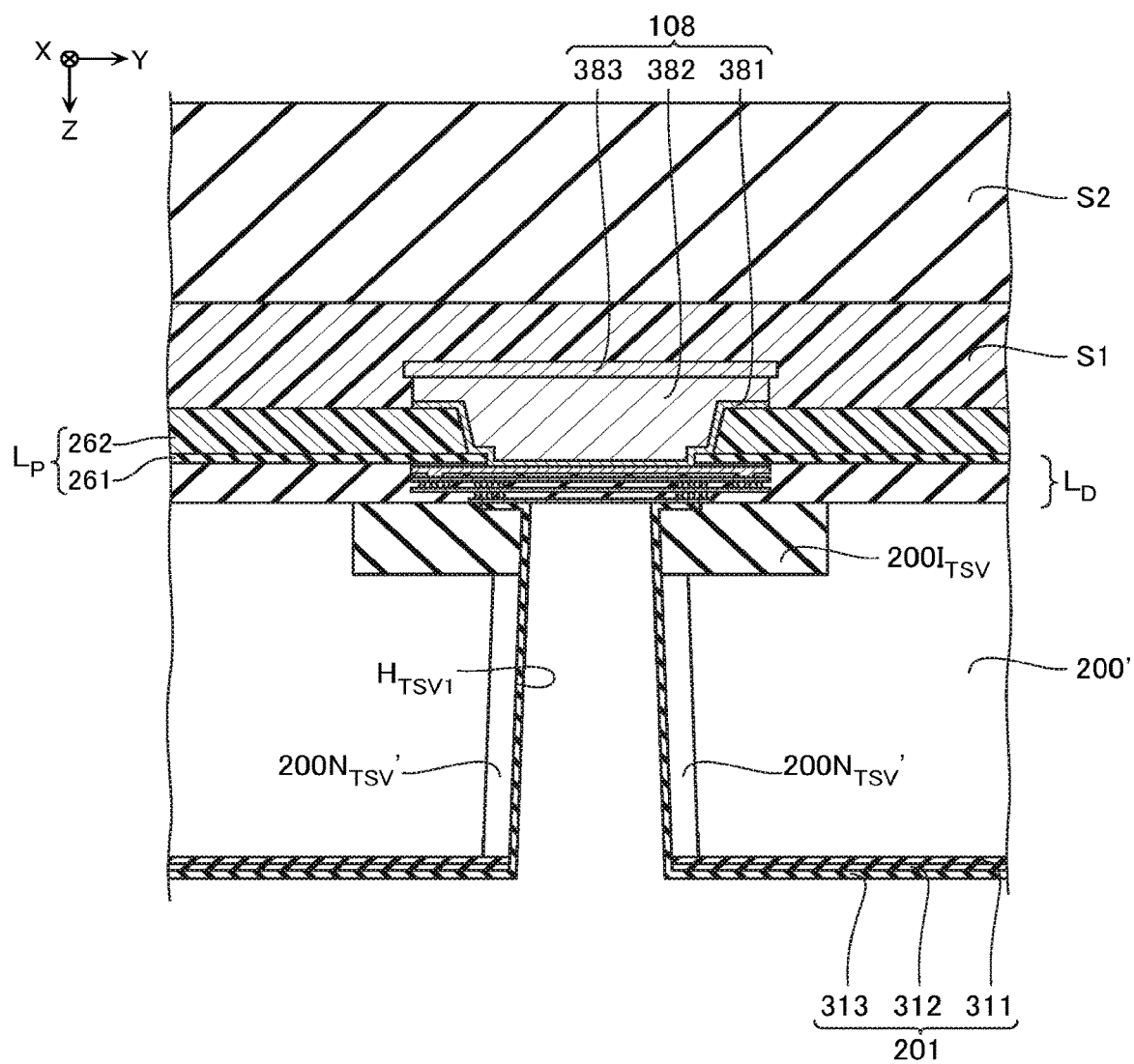
FIG. 26 is a schematic cross-sectional view for explaining the manufacturing method of the memory die $MD_2$.

Next, as shown in FIG. 26, the insulating layer 313 is formed on the surface (the lower surface in FIG. 26) of the insulating layer 312, and on the inner peripheral surface and bottom surface of the through-hole $H_{TSV1}$. This step is performed by a method such as CVD, for example. This step results in the insulating layer 201 being formed.

Subsequently, the substrate through-electrode 202 (FIGS. 18 and 19) is formed on the inside of the through-hole $H_{TSV1}$, and the rear-face electrode 107 is formed on the one end (the lower surface in FIGS. 18 and 19) of the substrate through-electrode 202, whereby the memory die $MD_2$ of the kind described with reference to FIGS. 18 and 19 is formed. Moreover, a plurality of the formed memory dies $MD_2$ are stacked on the supporting substrate 101 (FIG. 3), and these configurations are mounted on the mounting substrate 103 (FIG. 3) and sealed by the resin member 119 (FIG. 3), whereby the memory system according to the second embodiment is formed.

In the second embodiment too, similarly to in the first embodiment, it is possible for a leak current between the substrate through-electrode 202 and a region other than the impurity region $200N_{TSV}'$ of the semiconductor substrate 200', to be suppressed.

Moreover, in the second embodiment too, similarly to in the first embodiment, it is possible for a leak current between the substrate through-electrodes 202 to be suppressed.

Moreover, in the first embodiment, the resist R1 used in implantation of the impurity in the rear-face of the semiconductor substrate 200A was formed in the step described with reference to FIG. 10, and the resist R2 used in formation of the through-hole $H_{TSV1}$ in the rear-face of the semiconductor substrate 200A was formed in the step described with reference to FIG. 14, for example. On the other hand, in the second embodiment, as described with reference to FIGS. 21 to 24, for example, the resist R2 is used both in implantation of the impurity and in formation of the through-hole $H_{TSV1}$. The method according to the second embodiment results in the semiconductor memory device sometimes being manufacturable at a lower price than by the method according to the first embodiment, due to omission of the coating step and patterning step of the resist R1.

Third Embodiment

Figure 27:
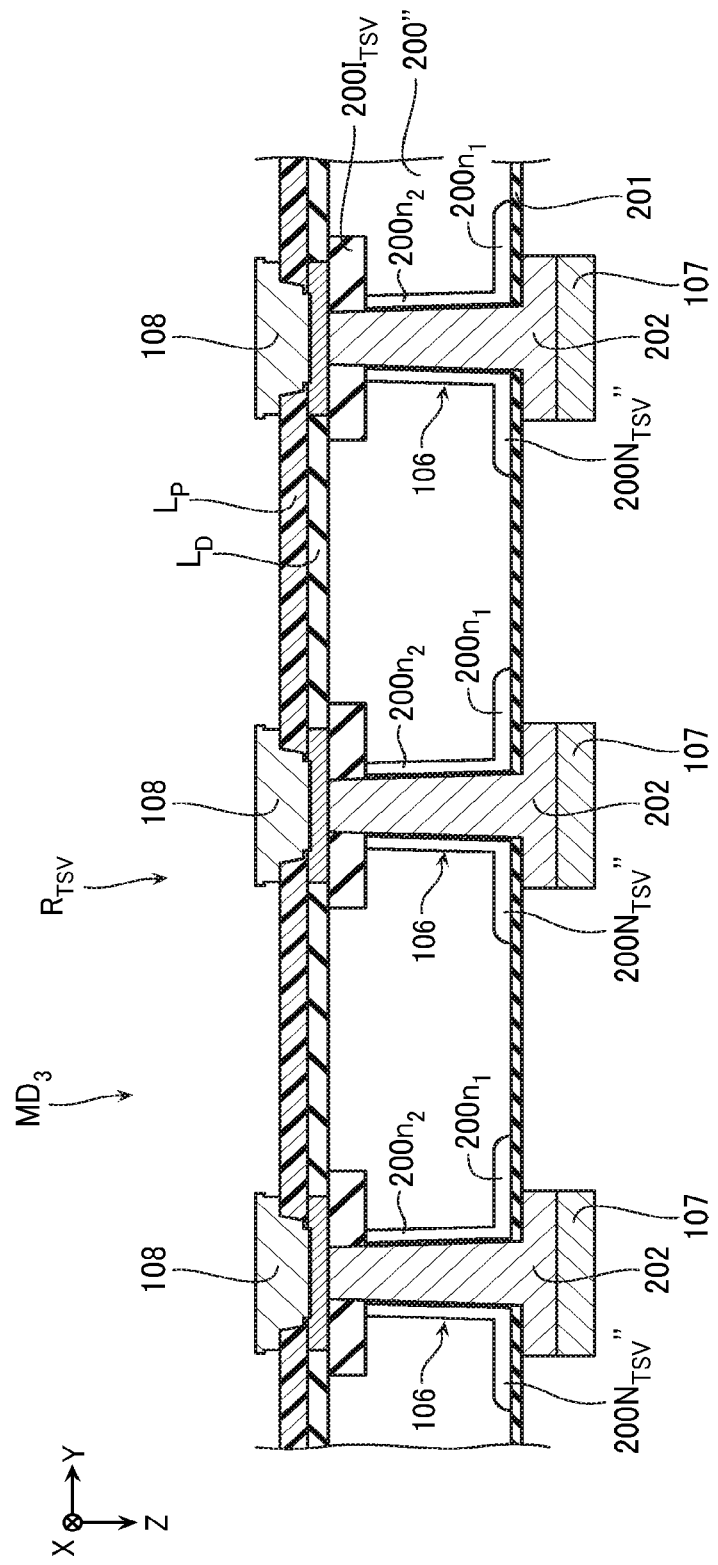
FIG. 27 is a schematic cross-sectional view showing a configuration example of a memory die $MD_3$ according to a third embodiment.

FIG. 27 is a schematic cross-sectional view showing a configuration example of a memory system according to a third embodiment.

The memory system according to the present embodiment is basically configured similarly to the memory system 10 according to the first embodiment. However, the memory system according to the present embodiment comprises a memory die $MD_3$ instead of the memory die $MD_1$. The memory die $MD_3$ is basically configured similarly to the memory die $MD_1$. However, the memory die $MD_3$ according to the present embodiment comprises a semiconductor substrate 200" instead of the semiconductor substrate 200. The semiconductor substrate 200" according to the present embodiment is basically configured similarly to the semiconductor substrate 200. However, the semiconductor substrate 200" according to the present embodiment does not have its rear-face provided with the impurity region $200N_{TSV}$. Moreover, the rear-face of the semiconductor substrate 200" and the inner peripheral surface of the through-hole $H_{TSV1}$ according to the present embodiment are provided with an impurity region $200N_{TSV}"$. The impurity region $200N_{TSV}"$ comprises: a rear-face portion $200n_1$ formed similarly to the impurity region $200N_{TSV}$; and a through-hole portion $200n_2$ formed similarly to the impurity region $200N_{TSV}'$.

A manufacturing method according to the present embodiment is similar to the manufacturing method according to the first embodiment up to the step described with reference to FIG. 15. In the manufacturing method according to the present embodiment, a structure shown in FIG. 15 undergoes steps of the step described with reference to FIG. 23 onwards, similarly to in the manufacturing method according to the second embodiment.

In the third embodiment too, similarly to in the first embodiment, it is possible for a leak current between the substrate through-electrode 202 and a region other than the impurity region $200N_{TSV}"$ of the semiconductor substrate 200', to be suppressed.

Moreover, in the third embodiment too, similarly to in the first embodiment, it is possible for a leak current between the substrate through-electrodes 202 to be suppressed.

Moreover, the impurity region $200N_{TSV}"$ according to the third embodiment comprises: the rear-face portion $200n_1$ formed similarly to the impurity region $200N_{TSV}$; and the through-hole portion $200n_2$ formed similarly to the impurity region $200N_{TSV}'$. Hence, a leak current is suitably suppressible both in the case where the above-mentioned kind of crack extends toward a front-face side of the semiconductor substrate 200" and in the case where the above-mentioned kind of crack extends toward a rear-face side of the semiconductor substrate 200".

OTHER EMBODIMENTS

That concludes description of the semiconductor memory devices according to the first through third embodiments. However, the semiconductor memory devices according to these embodiments are merely exemplifications, and specific configurations, operations, and so on, thereof may be appropriately adjusted.

Figure 28:
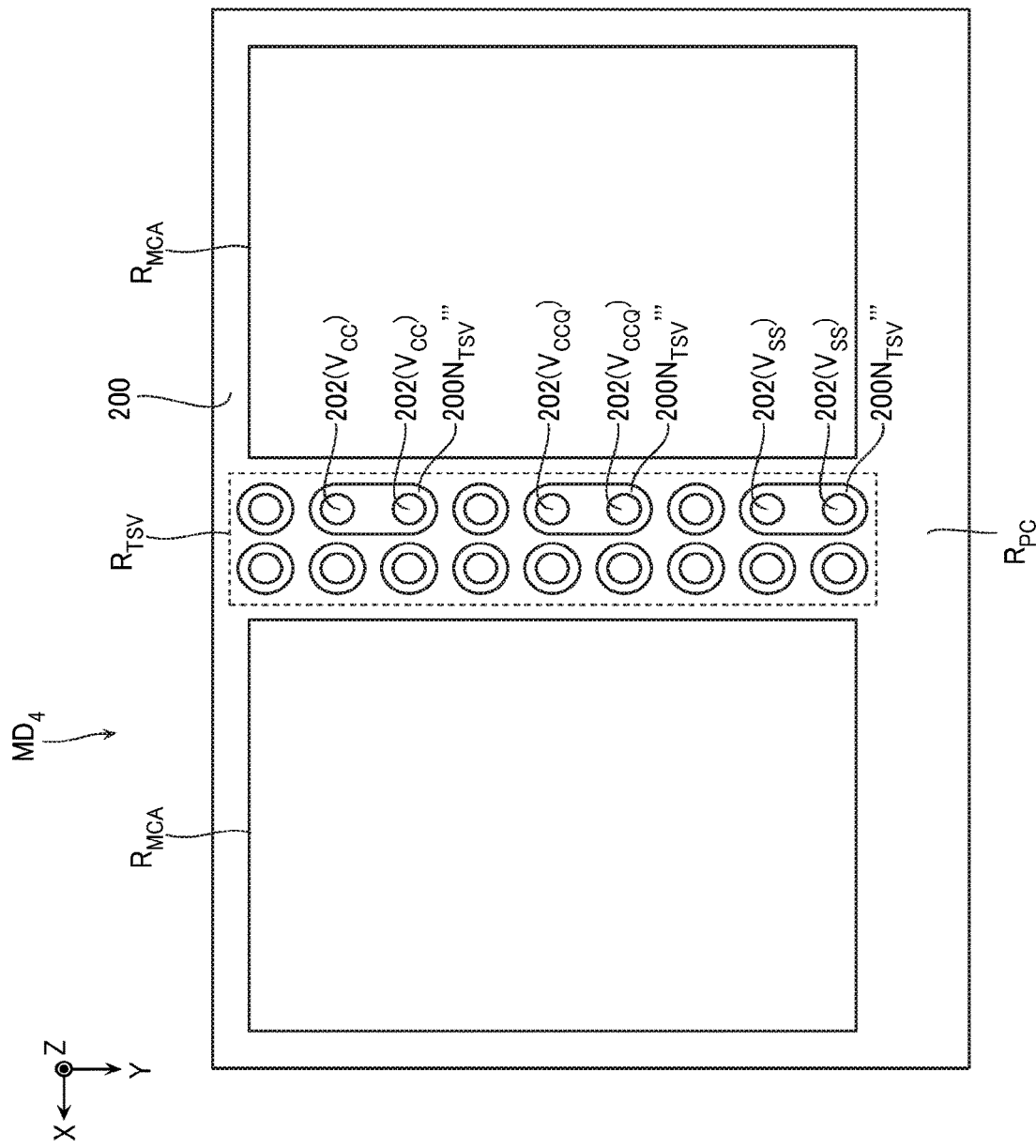
FIG. 28 is a schematic upper surface view showing a configuration example of a memory die $MD_4$ according to another embodiment.
Figure 29:
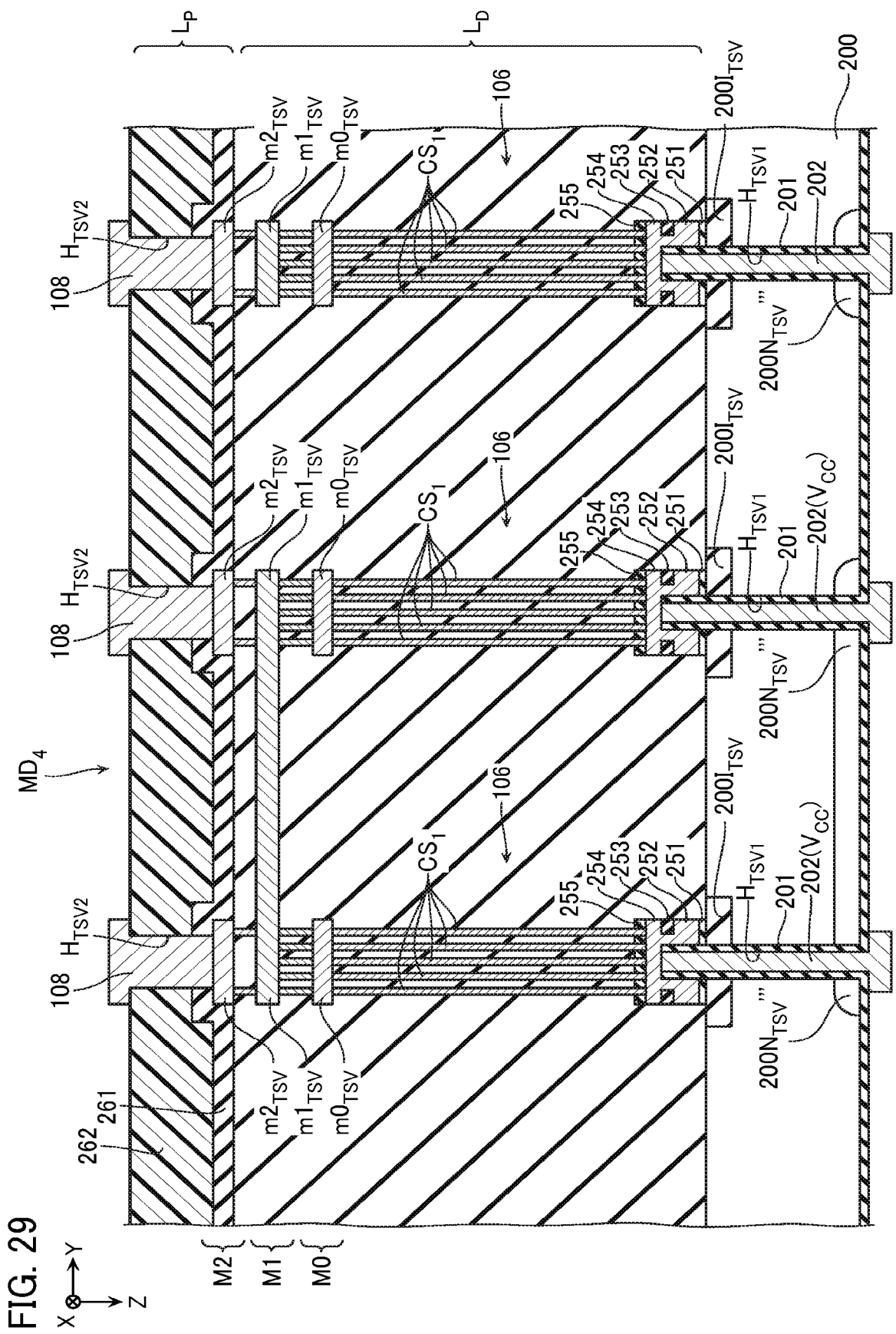
FIG. 29 is a schematic cross-sectional view showing a configuration example of the memory die $MD_4$.

For example, in the first embodiment, the plurality of impurity regions $200N_{TSV}$ provided on the rear-surface of the semiconductor substrate 200 were disposed separated from each other, as described with reference to FIGS. 4C and 5. However, in the case where, for example, as shown in FIG. 28, two or more substrate through-electrodes 202 adjacent in the X direction or the Y direction each function as the terminal supplying the power supply voltage $V_{CC}$, impurity regions $200N_{TSV}'''$ corresponding to these substrate through-electrodes 202 may be configured as a common region. Note that, as shown in FIG. 29, for example, at least some ones of the wirings $m0_{TSV}$, $m1_{TSV}$, $m2_{TSV}$ corresponding to such substrate through-electrodes 202 may be connected to each other. The same applies also to the terminals supplying the power supply voltage $V_{CCQ}$ and the terminals supplying the ground voltage $V_{SS}$.

Figure 30:
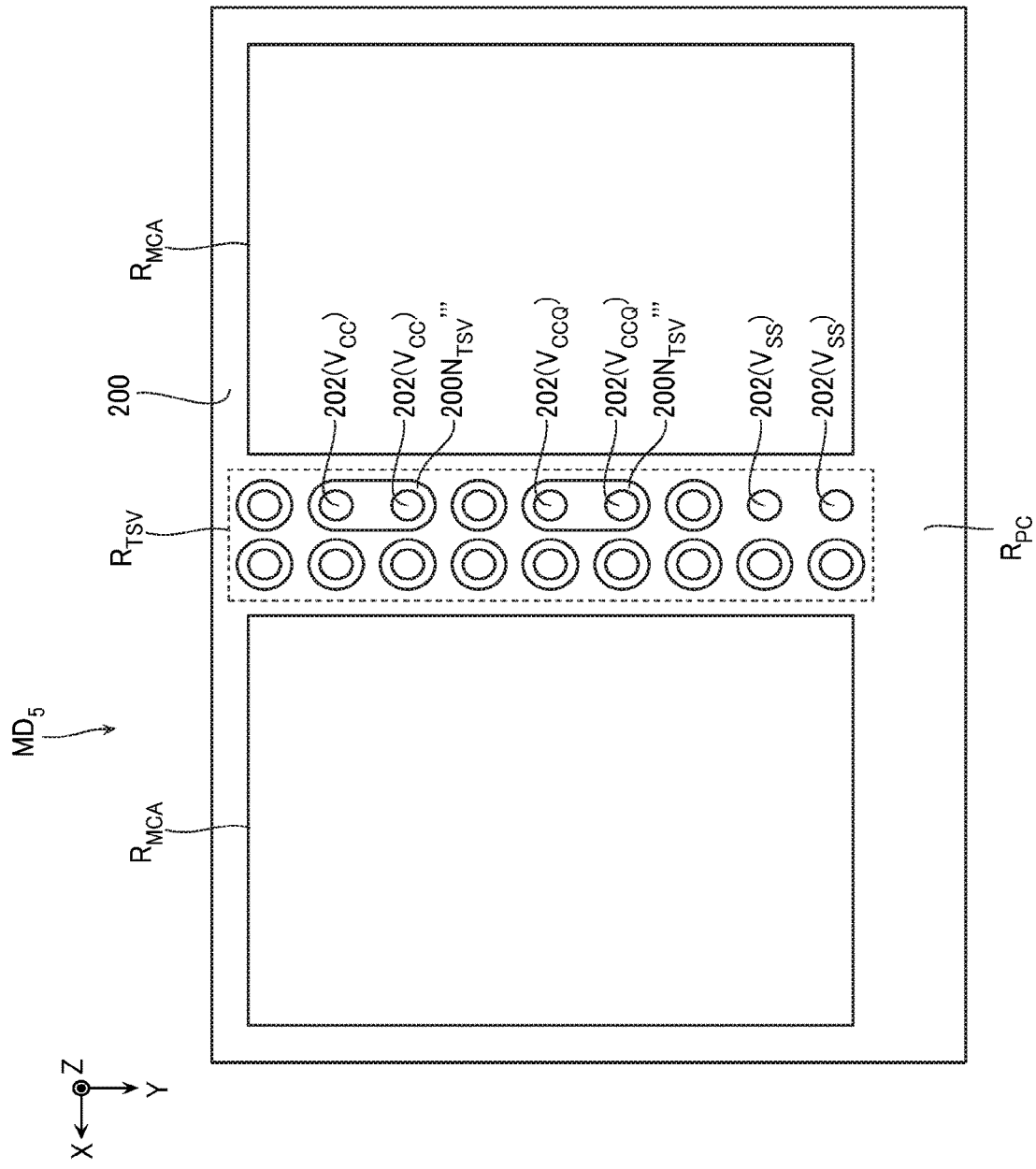
FIG. 30 is a schematic upper surface view showing a configuration example of a memory die $MD_5$ according to another embodiment.
Figure 31:
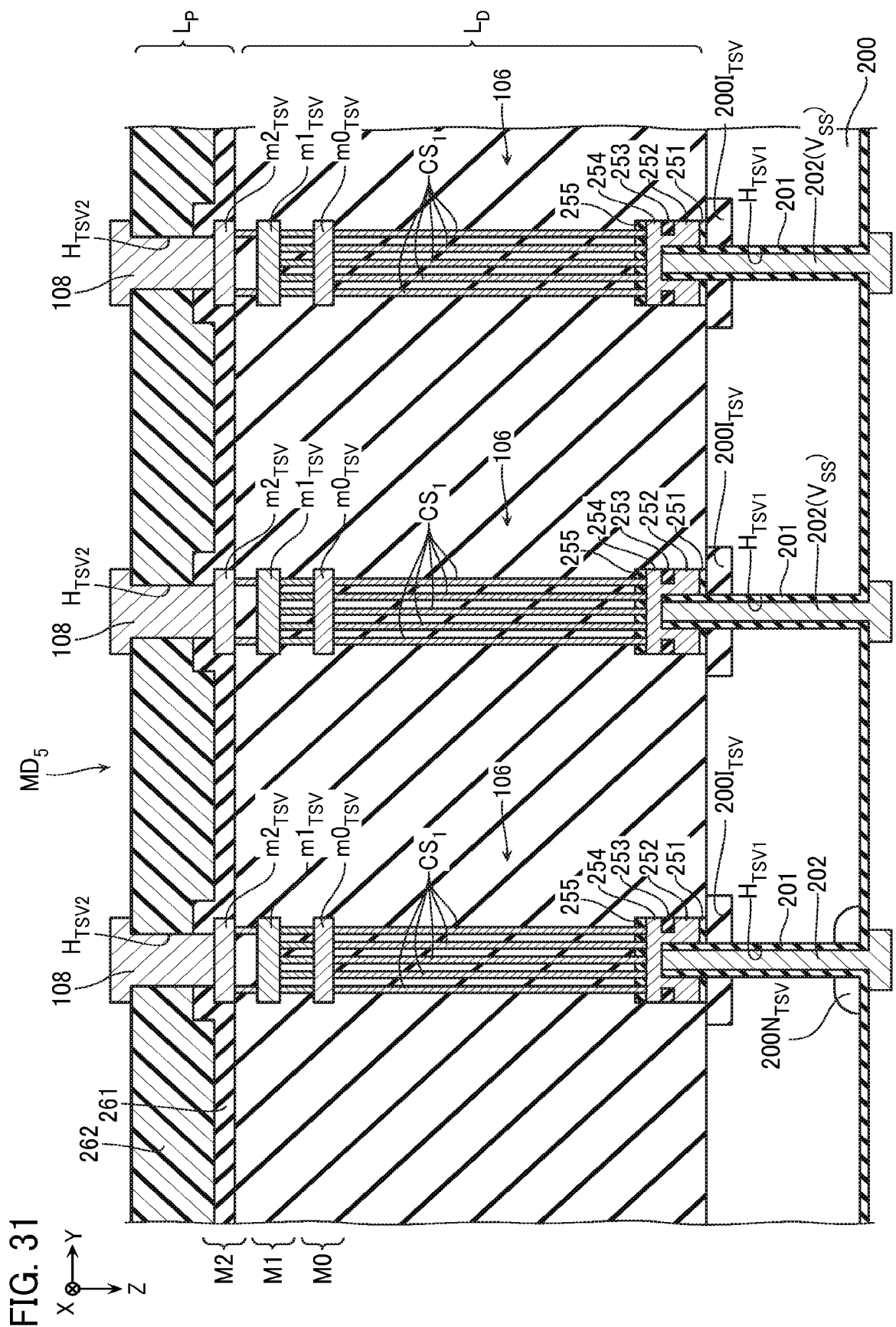
FIG. 31 is a schematic cross-sectional view showing a configuration example of the memory die $MD_5$.

Moreover, in the first embodiment, there was shown an example where all of the substrate through-electrodes 202 provided in the memory die $MD_1$ are provided with impurity regions $200N_{TSV}$ corresponding thereto, as described with reference to FIG. 4C, and so on. However, as shown in FIGS. 30 and 31, for example, those functioning as the terminals supplying the ground voltage $V_{SS}$, of the plurality of substrate through-electrodes 202 may have the impurity regions $200N_{TSV}$ corresponding thereto omitted.

Moreover, in the first through third embodiments, there were described examples where the semiconductor substrates 200, 200',200" are P type semiconductor substrates, and the impurity regions $200N_{TSV}$, $200N_{TSV}'$, $200N_{TSV}"$ are N type impurity regions. However, it is possible too for an N type semiconductor substrate to be provided instead of the P type semiconductor substrates, and for a P type impurity region to be provided instead of the N type impurity regions, for example.

Figure 32:
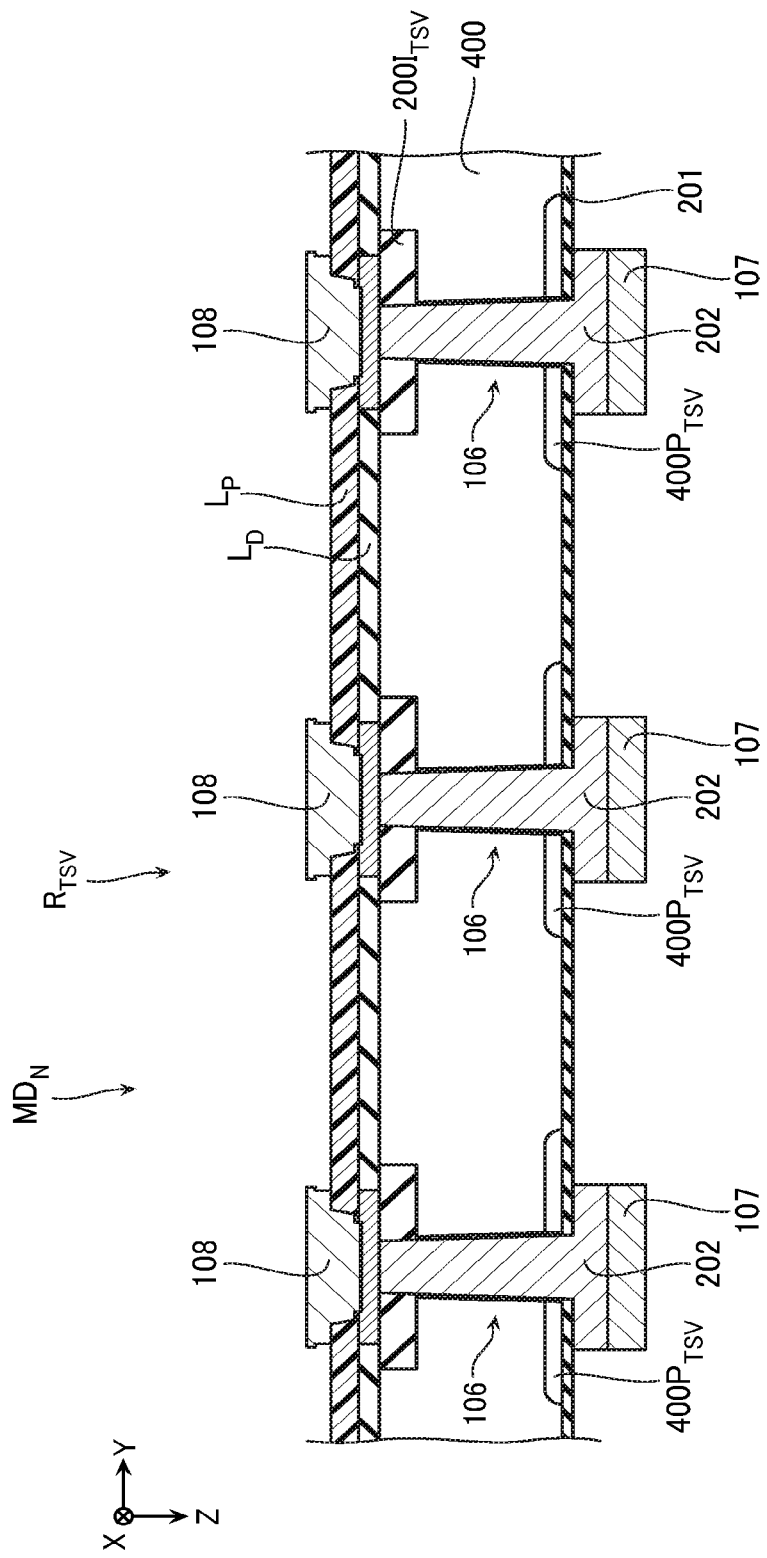
FIG. 32 is a schematic cross-sectional view showing a configuration example of a memory die $MD_N$.

For example, a memory die $MD_N$ shown in FIG. 32 is basically configured similarly to the memory die $MD_1$ according to the first embodiment. However, the memory die $MD_N$ comprises a semiconductor substrate 400 instead of the semiconductor substrate 200. The semiconductor substrate 400 is basically configured similarly to the semiconductor substrate 200. However, the semiconductor substrate 400 is an N type semiconductor substrate, not a P type semiconductor substrate. Moreover, the semiconductor substrate 400 does not have its rear-face provided with the impurity region $200N_{TSV}$. Moreover, the semiconductor substrate 400 has its rear-face provided with an impurity region $400P_{TSV}$. The impurity region $400P_{TSV}$ is basically configured similarly to the impurity region $200N_{TSV}$ according to the first embodiment. However, the impurity region $400P_{TSV}$ is a P type impurity region, not an N type impurity region. Note that in the illustrated example, the impurity region $400P_{TSV}$ is provided in a range similar to that of the impurity region $200N_{TSV}$ according to the first embodiment. However, it is possible too that, for example, the impurity region $400P_{TSV}$ is provided in a range similar to that of the impurity region $200N_{TSV}'$ according to the second embodiment or the impurity region $200N_{TSV}''$ according to the third embodiment.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate comprising a first surface and a second surface;
   a first electrode and a second electrode provided on a first surface side of the semiconductor substrate;
   a third electrode and a fourth electrode provided on a second surface side of the semiconductor substrate;
   a first through-electrode extending in a first direction intersecting the first surface and the second surface and including one end in the first direction and the other end in the first direction, the one end being connected to the first electrode, the other end being connected to the third electrode;
   a second through-electrode extending in the first direction and including one end in the first direction and the other end in the first direction, the one end being connected to the second electrode, the other end being connected to the fourth electrode; and
   a first insulating layer provided between the semiconductor substrate and the first through-electrode and provided between the semiconductor substrate and the second through-electrode,
   the first insulating layer comprising:
   a first portion provided between the semiconductor substrate and the first through-electrode; and
   a second portion provided between the semiconductor substrate and the second through-electrode,
   the second surface side of the semiconductor substrate comprising:
   a first impurity region of N type facing an outer peripheral surface of the first through-electrode via the first portion;
   a second impurity region of N type facing an outer peripheral surface of the second through-electrode via the second portion and being separated from the first impurity region; and
   a third impurity region of P type provided between the first impurity region and the second impurity region, the third impurity region contacting the first impurity region.

2. The semiconductor memory device according to claim 1, wherein
   the first impurity region surrounds an outer periphery of the first through-electrode on the second surface side of the semiconductor substrate, when viewed from the first direction, and
   the second impurity region surrounds an outer periphery of the second through-electrode on the second surface side of the semiconductor substrate, when viewed from the first direction.

3. The semiconductor memory device according to claim 1, wherein
   the third impurity region contacts the second impurity region.

4. The semiconductor memory device according to claim 1, wherein
   the third impurity region contacts the first insulating layer.

5. The semiconductor memory device according to claim 1, wherein
   the second through-electrode is separated from the first through-electrode.

6. The semiconductor memory device according to claim 1, wherein
   the first surface side of the semiconductor substrate includes:
   a first insulating region surrounding an outer peripheral surface of the first through-electrode via the first portion, when viewed from the first direction; and
   a second insulating region surrounding an outer peripheral surface of the second through-electrode via the second portion and being separated from the first insulating region, when viewed from the first direction.

7. The semiconductor memory device according to claim 1, wherein
   the first surface side of the semiconductor substrate includes a first insulating region surrounding an outer peripheral surface of the first through-electrode via the first portion, when viewed from the first direction, and
   the first impurity region extends along the outer peripheral surface of the first through-electrode from the second surface to the first insulating region.

8. The semiconductor memory device according to claim 7, wherein
   the first surface side of the semiconductor substrate includes a second insulating region surrounding an outer peripheral surface of the second through-electrode via the second portion, when viewed from the first direction, and
   the second impurity region extends along the outer peripheral surface of the second through-electrode from the second surface to the second insulating region.

9. The semiconductor memory device according to claim 1, comprising:
- a circuit region including a plurality of transistors provided on the first surface side of the semiconductor substrate;
- a first voltage supply line through which a first voltage is supplied to the circuit region;
- a second voltage supply line through which a second voltage is supplied to the circuit region;
- a first signal supply line through which a first signal is supplied to the circuit region; and
- a second signal supply line through which a second signal is supplied to the circuit region, wherein
- the first electrode is connected to one of the first voltage supply line, the second voltage supply line, the first signal supply line, and the second signal supply line, and
- the second electrode is connected to another of the first voltage supply line, the second voltage supply line, the first signal supply line, and the second signal supply line.

10. The semiconductor memory device according to claim 1, comprising:
- a fifth electrode provided on the first surface side of the semiconductor substrate;
- a sixth electrode provided on the second surface side of the semiconductor substrate; and
- a third through-electrode extending in the first direction and including one end in the first direction and the other end in the first direction, the one end being connected to the fifth electrode, the other end being connected to the sixth electrode, wherein
- the first insulating layer comprises a third portion provided between the semiconductor substrate and the third through-electrode,
- the first impurity region faces an outer peripheral surface of the third through-electrode via the third portion, and
- the first through-electrode is provided between the second through-electrode and the third through-electrode.

11. The semiconductor memory device according to claim 10, comprising:
- a circuit region including a plurality of transistors provided on the first surface side of the semiconductor substrate;
- a first voltage supply line through which a first voltage is supplied to the circuit region;
- a second voltage supply line through which a second voltage is supplied to the circuit region;
- a first signal supply line through which a first signal is supplied to the circuit region; and
- a second signal supply line through which a second signal is supplied to the circuit region, wherein
- the first electrode is connected to one of the first voltage supply line, the second voltage supply line, the first signal supply line, and the second signal supply line,
- the second electrode is connected to another of the first voltage supply line, the second voltage supply line, the first signal supply line, and the second signal supply line, and
- the fifth electrode is electrically connected to the first electrode.

12. A semiconductor memory device comprising:
- a semiconductor substrate comprising a first surface and a second surface;
- a first electrode and a second electrode provided on a first surface side of the semiconductor substrate;
- a third electrode and a fourth electrode provided on a second surface side of the semiconductor substrate;
- a first through-electrode extending in a first direction intersecting the first surface and the second surface and including one end in the first direction and the other end in the first direction, the one end being connected to the first electrode, the other end being connected to the third electrode;
- a second through-electrode extending in the first direction and including one end in the first direction and the other end in the first direction, the one end being connected to the second electrode, the other end being connected to the fourth electrode; and
- a first insulating layer provided between the semiconductor substrate and the first through-electrode and provided between the semiconductor substrate and the second through-electrode,
- the first insulating layer comprising:
- a first portion provided between the semiconductor substrate and the first through-electrode; and
- a second portion provided between the semiconductor substrate and the second through-electrode,
- the semiconductor substrate comprising:
- a first impurity region of N type facing an outer peripheral surface of the first through-electrode via the first portion;
- a second impurity region of N type facing an outer peripheral surface of the second through-electrode via the second portion and being separated from the first impurity region;
- a third impurity region of P type provided between the first impurity region and the second impurity region, the third impurity region contacting the first impurity region;
- a first insulating region provided on the first surface side and surrounding an outer peripheral surface of the first through-electrode via the first portion, when viewed from the first direction; and
- a second insulating region provided on the first surface side, surrounding an outer peripheral surface of the second through-electrode via the second portion, and being separated from the first insulating region, when viewed from the first direction,
- the first impurity region extending along the outer peripheral surface of the first through-electrode from the second surface to the first insulating region, and
- the second impurity region extending along the outer peripheral surface of the second through-electrode from the second surface to the second insulating region.

13. The semiconductor memory device according to claim 12, wherein
- the first impurity region surrounds an outer periphery of the first through-electrode on the second surface side of the semiconductor substrate, when viewed from the first direction, and
- the second impurity region surrounds an outer periphery of the second through-electrode on the second surface side of the semiconductor substrate, when viewed from the first direction.

14. The semiconductor memory device according to claim 12, wherein
- the third impurity region contacts the second impurity region.

15. The semiconductor memory device according to claim 12, wherein
- the third impurity region contacts the first insulating layer.

16. The semiconductor memory device according to claim 12, wherein
the second through-electrode is separated from the first through-electrode.

17. The semiconductor memory device according to claim 12, comprising:
a circuit region including a plurality of transistors provided on the first surface side of the semiconductor substrate;
a first voltage supply line through which a first voltage is supplied to the circuit region;
a second voltage supply line through which a second voltage is supplied to the circuit region;
a first signal supply line through which a first signal is supplied to the circuit region; and
a second signal supply line through which a second signal is supplied to the circuit region, wherein
the first electrode is connected to one of the first voltage supply line, the second voltage supply line, the first signal supply line, and the second signal supply line, and
the second electrode is connected to another of the first voltage supply line, the second voltage supply line, the first signal supply line, and the second signal supply line.

18. A semiconductor memory device comprising:
a semiconductor substrate comprising a first surface and a second surface;
a first electrode and a second electrode provided on a first surface side of the semiconductor substrate;
a third electrode and a fourth electrode provided on a second surface side of the semiconductor substrate;
a first through-electrode extending in a first direction intersecting the first surface and the second surface and including one end in the first direction and the other end in the first direction, the one end being connected to the first electrode, the other end being connected to the third electrode;
a second through-electrode extending in the first direction and including one end in the first direction and the other end in the first direction, the one end being connected to the second electrode, the other end being connected to the fourth electrode; and
a first insulating layer provided between the semiconductor substrate and the first through-electrode and provided between the semiconductor substrate and the second through-electrode,
the first insulating layer comprising:
a first portion provided between the semiconductor substrate and the first through-electrode; and
a second portion provided between the semiconductor substrate and the second through-electrode,
the second surface side of the semiconductor substrate comprising:
a first impurity region of N type facing an outer peripheral surface of the first through-electrode via the first portion; and
a second impurity region of P type contacting the first impurity region, and
the second through-electrode being separated from the first impurity region.

19. The semiconductor memory device according to claim 18, comprising:
a circuit region including a plurality of transistors provided on the first surface side of the semiconductor substrate;
a first voltage supply line through which a first voltage is supplied to the circuit region, the first voltage being a ground voltage;
a second voltage supply line through which a second voltage is supplied to the circuit region; and
a signal supply line through which a first signal is supplied to the circuit region, wherein
the first electrode is connected to the second voltage supply line or the signal supply line, and
the second electrode is connected to the first voltage supply line.

20. The semiconductor memory device according to claim 18, wherein
the second surface of the semiconductor substrate comprises a third impurity region of N type facing an outer peripheral surface of the second through-electrode via the second portion.

* * * * *